United States Patent
Kim

(10) Patent No.: US 10,706,939 B2
(45) Date of Patent: Jul. 7, 2020

(54) MEMORY DEVICE, MEMORY SYSTEM, AND METHOD OF OPERATING MEMORY DEVICE

(71) Applicant: SK hynix Inc., Gyeonggi-do (KR)

(72) Inventor: Jong Wook Kim, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/269,202

(22) Filed: Feb. 6, 2019

(65) Prior Publication Data

US 2020/0020404 A1 Jan. 16, 2020

(30) Foreign Application Priority Data

Jul. 10, 2018 (KR) .................. 10-2018-0080219

(51) Int. Cl.
 *G11C 16/04* (2006.01)
 *G11C 16/16* (2006.01)
 *G11C 16/34* (2006.01)
 *G11C 16/12* (2006.01)
 *G11C 8/08* (2006.01)
 *G11C 7/14* (2006.01)

(52) U.S. Cl.
 CPC .............. *G11C 16/16* (2013.01); *G11C 7/14* (2013.01); *G11C 8/08* (2013.01); *G11C 16/0483* (2013.01); *G11C 16/12* (2013.01); *G11C 16/3445* (2013.01); *G11C 16/3459* (2013.01)

(58) Field of Classification Search
 CPC . G11C 16/10; G11C 16/0483; G11C 16/3459; G11C 16/14; G11C 16/16; G11C 16/3418; G11C 16/349; G11C 16/08; G11C 16/26; G11C 16/32; G11C 16/0408; G11C 16/0466; G11C 16/24
 USPC ............. 365/185.11, 185.02, 185.12, 185.17
 See application file for complete search history.

(56) References Cited

U.S. PATENT DOCUMENTS

2015/0332783 A1* 11/2015 Jeong .................... G11C 16/10
 365/185.11

FOREIGN PATENT DOCUMENTS

| KR | 1020130072083 | 7/2013 |
| KR | 1020160039960 | 4/2016 |
| KR | 1020180018923 | 2/2018 |

* cited by examiner

*Primary Examiner* — Thong Q Le
(74) *Attorney, Agent, or Firm* — IP & T Group LLP

(57) ABSTRACT

Provided herein may be a memory device, a memory system, and a method of operating the memory device. When all of normal operation loops associated with a program operation or an erase operation of a memory cell fail, a retry operation of repeating at least one of the normal operation loops is performed in consideration of the degraded state of at least one of a source select transistor, a drain select transistor, and a dummy cell.

25 Claims, 17 Drawing Sheets

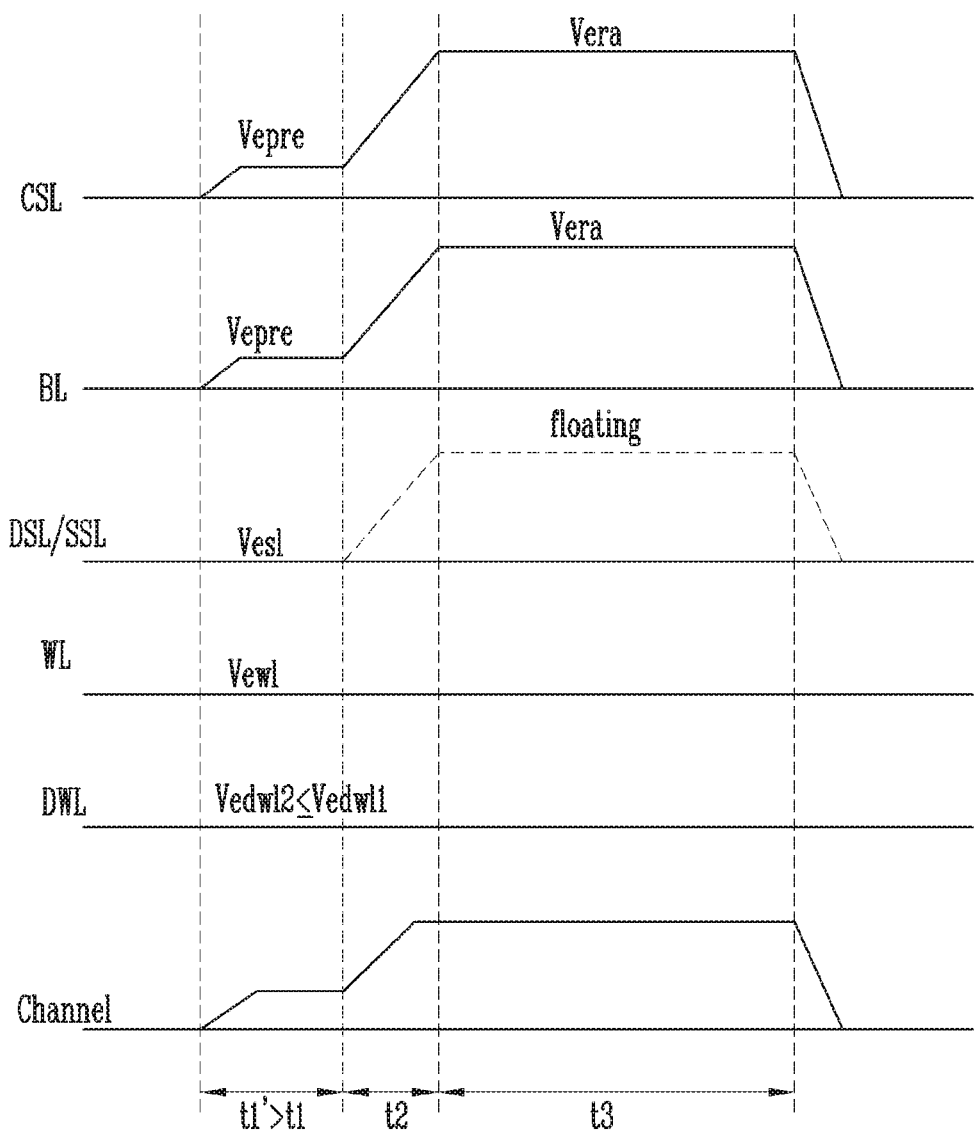

MEMORY DEVICE, MEMORY SYSTEM, AND METHOD OF OPERATING MEMORY DEVICE

CROSS-REFERENCE TO RELATED APPLICATION

The present application claims priority under 35 U.S.C. § 119(a) to Korean patent application number 10-2018-0080219 filed on Jul. 10, 2018, the entire disclosure of which is incorporated herein by reference in its entirety.

BACKGROUND

Field of Invention

Various embodiments of the present disclosure generally relate to a semiconductor memory. Particularly, the embodiments relate to a nonvolatile memory device, a memory system having the nonvolatile memory device, and a method of operating the nonvolatile memory device.

Description of Related Art

A semiconductor memory device is a storage device implemented using a semiconductor such as silicon (Si), germanium (Ge) or indium phosphide (InP). Semiconductor memory devices are classified into a volatile memory device and a nonvolatile memory device.

The nonvolatile memory device is a memory device which retains data stored therein even when power supply is interrupted. Therefore, the nonvolatile memory device is widely used in various electronic devices so as to store data that should be retained regardless of whether power supply is interrupted.

According to a method of storing data, nonvolatile memory devices may be classified into a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc.

Among the memory devices, the flash memory device is a large-capacity storage device that is widely used in various fields. When the number of program/erase cycles increases, the characteristics of the flash memory device may be degraded.

SUMMARY

An embodiment of the present disclosure may provide for a method of operating a memory device. The method of operating the memory device may include performing a normal operation including normal operation loops so that a selected memory cell in a selected cell string has a target threshold voltage, wherein the normal operation loops are performed based on an operating voltage that is sequentially increased by a step voltage from a first operating pulse to a k-th operating pulse. The method of operating the memory device may include performing a first retry operation of repeating at least one of the normal operation loops when a k-th normal operation loop for the k-th operating pulse of the normal operation fails. Here, at least one of a first voltage setting condition for a source select line coupled to a source select transistor of the selected cell string, a second voltage setting condition for a drain select line coupled to a drain select transistor of the selected cell string, and a third voltage setting condition for a dummy word line coupled to a dummy cell of the selected cell string is controlled in the first retry operation in a way different from that in the normal operation.

An embodiment of the present disclosure may provide for a method of operating a memory device. The method of operating a memory device may include performing a normal operation including normal operation loops so that a selected memory cell in a selected cell string has a target threshold voltage, wherein the normal operation loops are performed based on an operating voltage that is sequentially increased by a step voltage from a first operating pulse to a k-th operating pulse. The method of operating a memory device may include resetting a threshold voltage of at least one of a source select transistor of the selected cell string, a drain select transistor of the selected cell string, and a dummy cell of the selected cell string when a k-th normal operation loop for the k-th operating pulse of the normal operation fails. The method of operating a memory device may include performing a first retry operation of repeating at least one of the normal operation loops after the threshold voltage has been reset.

An embodiment of the present disclosure may provide for a memory device. The memory device may include a cell string including at least one memory cell coupled between a common source line and a bit line, a source select transistor coupled between the memory cell and the common source line, a drain select transistor coupled between the memory cell and the bit line, and a dummy cell coupled at least one of between the source select transistor and the memory cell and between the drain select transistor and the memory cell. The memory device may include a control logic configured to perform a normal operation including normal operation loops associated with a program operation or an erase operation on the memory cell, and thereafter perform a retry operation of repeating at least one of the normal operation loops when the normal operation is determined to have failed. Here, each of the normal operation loops is performed at least once, and thereafter whether the normal operation has passed or failed is determined, wherein the normal operation loops are performed based on an operating voltage that is sequentially increased by a step voltage from a first operating pulse to a k-th operating pulse.

In the memory device according to an embodiment of the present disclosure, at least one of a first voltage setting condition for a source select line coupled to the source select transistor, a second voltage setting condition for a drain select line coupled to the drain select transistor, and a third voltage setting condition for a dummy word line coupled to the dummy cell may be controlled in the retry operation in a way different from that in the normal operation.

When the retry operation is associated with the program operation, a program step of applying a program voltage corresponding to the operating voltage to the word line coupled to the memory cell may be performed such that at least one of levels of voltages applied to the source select line, the drain select line, and the dummy word line may be controlled to be higher in the retry operation than in the normal operation.

When the retry operation is associated with the erase operation, an interval during which a select voltage is applied to the source select line and the drain select line and during which a precharge voltage is applied to the common source line may be controlled to be longer in the retry operation than in the normal operation. Here, a level of a voltage applied to the dummy word line may be controlled to be lower in the retry operation than in the normal operation.

The memory device according to an embodiment may control so that the retry operation is performed after a threshold voltage reset step of erasing and then programming at least one of the source select transistor, the drain select transistor, and the dummy cell. In this case, a first voltage setting condition for a source select line coupled to the source select transistor, a second voltage setting condition for a drain select line coupled to the drain select transistor, and a third voltage setting condition for a dummy word line coupled to the dummy cell may be controlled in the retry operation in a way identical to that in the normal operation.

An embodiment of the present disclosure may provide for memory system. The memory system may include a nonvolatile memory device including a memory cell array including at least one cell string coupled between a common source line and a bit line, and a control logic configured to perform a normal operation including normal operation loops associated with a program operation or an erase operation on a memory cell in the cell string, and a memory controller configured to provide a command and an address to the nonvolatile memory device to control the nonvolatile memory device, wherein at least one of the control logic and the memory controller is configured to perform a retry operation of repeating at least one of the normal operation loops when the normal operation is determined to have failed after the normal operation has been performed on the memory cell.

An embodiment of the present disclosure may provide for an operating method of a memory device. The method of operating may include performing a normal program operation to a memory cell; and performing, when the normal program operation fails, a retry program operation to the memory cell by increasing one or more among voltages applied to the source select line, the drain select line and the dummy word line for the memory cell.

An embodiment of the present disclosure may provide for an operating method of a memory device. The method of operating may include performing a normal program operation to a memory cell; resetting, when the normal program operation fails, threshold voltages of one or more among a source select transistor, a drain select transistor and a dummy cell for the memory cell; and performing a retry program operation to the memory cell.

An embodiment of the present disclosure may provide for an operating method of a memory device. The method of operating may include performing a normal erase operation to a memory cell; and performing, when the normal erase operation fails, a retry erase operation to the memory cell by applying a precharge voltage and a select voltage for a longer duration than the normal erase operation.

An embodiment of the present disclosure may provide for an operating method of a memory device. The method of operating may include performing a normal erase operation to a memory cell; resetting, when the normal erase operation fails, threshold voltages of one or more among a source select transistor, a drain select transistor and a dummy cell for the memory cell; and performing a retry erase operation to the memory cell.

BRIEF DESCRIPTION OF THE DRAWINGS

FIGS. 10A and 10B are diagrams illustrating retry operations based on the ISPE scheme.

DETAILED DESCRIPTION

Various exemplary embodiments of the present invention are described below, and are presented to enable those skilled in the applicable art to practice the invention. However, as those skilled in the art will recognize in light of the following disclosure, various details, arrangements and/or configurations of the disclosed embodiments may be varied or modified without departing from the spirit and scope of the present invention. It is noted that reference to "an embodiment" does not necessarily mean only one embodiment, and different references to "an embodiment" are not necessarily to the same embodiment(s).

It will be understood that, although the terms "first" and/or "second" may be used herein to identify various elements, these elements are not limited by these terms. Rather, these terms are only used to distinguish one element from another element that otherwise have the same or similar names. For example, a first element in one instance could be termed a second element in another instance without departing from the teachings of the present disclosure.

It will be understood that when an element is referred to as being "coupled" or "connected" to, or in "communication" with, another element, such coupling, connection, or communication may be wired or wireless, and also may be direct or indirect, i.e., through one or more intervening elements, unless stated, or the context requires, otherwise. Other expressions that explain the relationship among elements, such as "between" and "adjacent to" should be construed in the same way.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Various embodiments of the present disclosure are directed to a memory device, a memory system, and a method of operating the memory device, which can reduce the deterioration of performance of the memory device attributable to an increase in the number of program/erase cycles.

Figure 1:
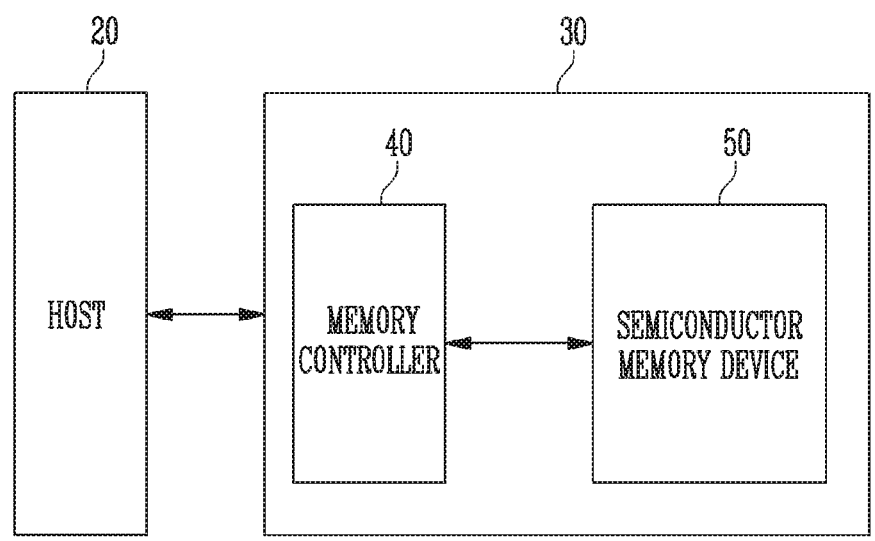
FIG. 1 is a block diagram illustrating a data processing system according to an embodiment of the present disclosure.

FIG. 1 is a block diagram illustrating a data processing system 10 according to an embodiment of the present disclosure.

Referring to FIG. 1, the data processing system 10 may include a host 20 and a memory system 30.

The host 20 may communicate with the memory system 30 through at least one of various interface protocols. By way of example and not limitation, the interface protocol may be any one of various protocols such as a Peripheral Component Interconnect (PCI) protocol, a Peripheral Component Interconnect-express (PCI-e or PCIe) protocol, an Advanced Technology Attachment (ATA) protocol, a Serial ATA (SATA) protocol, a Parallel ATA (PATA) protocol, a Small computer small interface (SCSI) protocol, a Serial attached SCSI (SAS) protocol, a Universal Serial Bus (USB) protocol, a Multi-Media Card (MMC) protocol, an Enhanced Small Disk Interface (ESDI) protocol, and an Integrated Drive Electronics (IDE) protocol.

The memory system 30 may include a memory controller 40 and a semiconductor memory device 50.

The memory controller 40 may control overall operations of the memory system 30, and may control data exchange between the host 20 and the memory device 50. For example, the memory controller 40 may control a program operation, an erase operation, a read operation, etc. on the semiconductor memory device 50 in response to a request from the host 20. The memory controller 40 may provide commands and addresses to the semiconductor memory device 50.

The semiconductor memory device 50 may include a nonvolatile memory device which can retain data stored therein even when power is not supplied. For example, the semiconductor memory device 50 may be a NAND flash memory. The semiconductor memory device 50 may perform a program operation, an erase operation, and a read operation in response to the commands and addresses provided from the memory controller 40.

In an embodiment, the semiconductor memory device 50 may perform a normal operation including normal operation loops associated with the program operation or the erase operation.

At least one of the memory controller 40 and the semiconductor memory device 50 according to the embodiment of the present disclosure is configured such that a retry operation of repeating at least one of the normal operation loops may be performed on the semiconductor memory device 50 when the normal operation is determined to have failed. For example, the retry operation may be performed on the semiconductor memory device 50 under the control of the memory controller 40. Alternatively, the retry operation may be internally performed in the semiconductor memory device 50 by a control logic included in the semiconductor memory device 50 without the intervention of the memory controller 40.

The retry operation may be performed to compensate for the degradation of characteristics of the semiconductor memory device 50 caused by an increase in the number of program/erase cycles.

Figure 2:
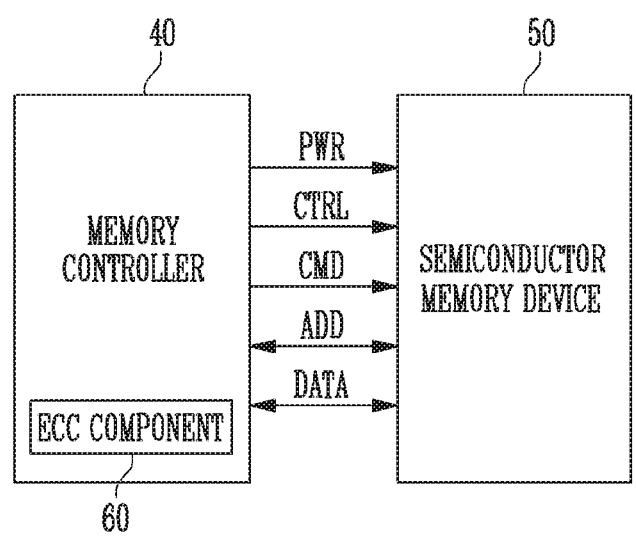
FIG. 2 is a block diagram illustrating a memory system according to an embodiment of the present disclosure.

FIG. 2 is a block diagram illustrating the memory system 30 according to an embodiment of the present disclosure.

Referring to FIG. 2, the semiconductor memory device 50 may receive a command CMD and an address ADD from the memory controller 40 through input/output lines. The semiconductor memory device 50 may exchange data DATA and an address ADD with the memory controller 40 through the input/output lines. Further, the semiconductor memory device 50 may receive power PWR from the memory controller 40 through a power line, and may receive a control signal CTRL from the memory controller 40 through a control line. The control signal CTRL may include a command latch enable signal, an address latch enable signal, a chip enable signal, a write enable signal, a read enable signal, etc.

The memory controller 40 may include an error correction code (ECC) component 60 for correcting error bits.

The ECC component 60 may detect and correct errors by encoding data to be stored in the semiconductor memory device 50 or by decoding data read from the semiconductor memory device 50. The ECC component 60 has error correction capability at a predetermined level. The ECC component 60 may detect and correct errors within the error correction capability. However, when a number of error bits beyond the error correction capability are detected, errors cannot be corrected.

A case where errors cannot be corrected by the ECC component 60 is referred to as an uncorrectable error correction code (UECC). When the UECC occurs, the memory controller 40 according to an embodiment may perform a retry operation on a memory block or a page in which the UECC occurs.

Figure 3:
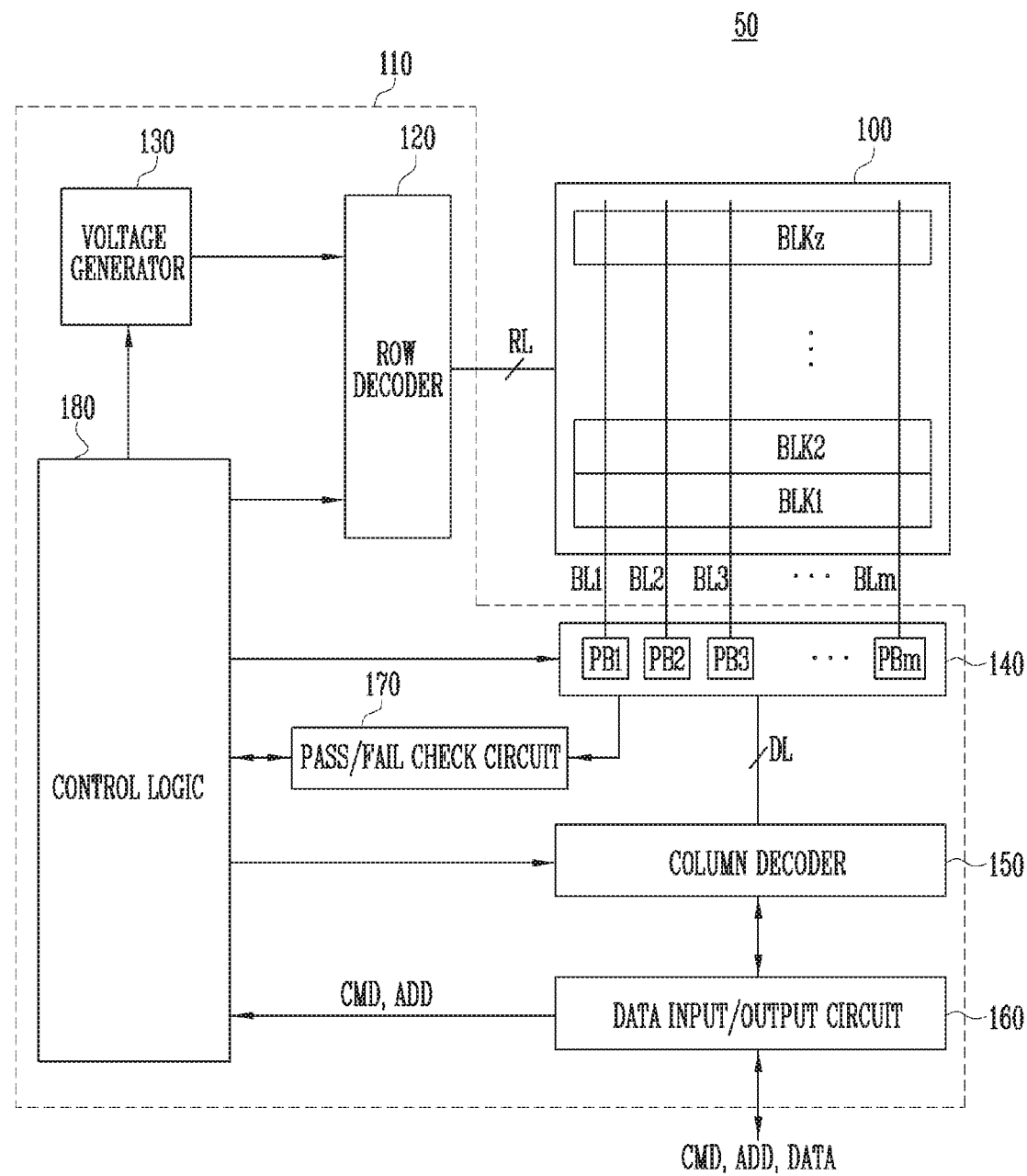
FIG. 3 is a block diagram illustrating a semiconductor memory device according to an embodiment of the present disclosure.

FIG. 3 is a block diagram illustrating the semiconductor memory device 50 according to an embodiment of the present disclosure.

Referring to FIG. 3, the semiconductor memory device 50 may include a memory cell array 100 and a peripheral circuit 110. The semiconductor memory device 50 may be a nonvolatile memory device, for example, a flash memory. However, the semiconductor memory device 50 according to an embodiment of the present disclosure may be applied to nonvolatile memory devices other than a NAND flash memory. For example, the nonvolatile memory device may be implemented as a read-only memory (ROM), a mask ROM (MROM), a programmable ROM (PROM), an erasable programmable ROM (EPROM), an electrically erasable programmable ROM (EEPROM), a ferromagnetic RAM (FRAM), a phase-change RAM (PRAM), a magnetic RAM (MRAM), a resistive RAM (RRAM), or a NOR flash memory.

The memory cell array 100 includes a plurality of memory blocks BLK1 to BLKz. The memory blocks BLK1 to BLKz are coupled to a row decoder 120 through row lines RL and are coupled to a read and write circuit 140 through bit lines BL1 to BLm. Each of the memory blocks BLK1 to BLKz includes a plurality of memory cells. The plurality of memory cells may be nonvolatile memory cells. The plurality of memory cells may be divided into a plurality of cell strings. Each of the memory cells stores one bit of data or two or more bits of data.

The peripheral circuit 110 may include the row decoder 120, a voltage generator 130, the read and write circuit 140, a column decoder 150, a data input/output circuit 160, a pass/fail check circuit 170, and a control logic 180.

The row decoder 120 is coupled to the memory cell array 100 through the row lines RL. The row lines RL include drain select lines, word lines, dummy word lines, source select lines, and a common source line. In accordance with an embodiment, the row lines RL may further include a pipe gate.

The row decoder 120 may receive a row address from the control logic 180, decode the received row address, and then select a memory block and a page. In this way, one memory block may be selected, and one page may be selected from the selected memory block.

The voltage generator 130 may generate voltages required for various operations under the control of the control logic 180. For example, the voltage generator 130 may generate various operating voltages, such as a program voltage, a pass voltage, a program read voltage, a program verify voltage, an erase read voltage, an erase voltage, an erase verify voltage, a turn-on voltage, and a turn-off voltage, depending on the operating code output from the control logic 180. The operating voltages generated by the voltage generator 130 are not limited to the above-described examples.

The operating voltages generated by the voltage generator 130 may be transferred to the row lines RL of the memory block selected by the row decoder 120.

The column decoder 150 may receive a column address from the control logic 180, decode the received column address, and then select data lines DL. For example, the column decoder 150 may transmit and receive data to and from the read and write circuit 140 or the data input/output circuit 160 by sequentially selecting the data lines DL in response to the column address. For example, during a program operation, the column decoder 150 may transmit data received from the data input/output circuit 160 to the read and write circuit 140 through the data lines DL. For example, first to m-th page buffers PB1 to PBm included in the read and write circuit 140 may temporarily store the data received through the data lines DL, and may program selected memory cells by transmitting the stored data to the bit lines BL1 to BLm when a program voltage is applied to a selected word line.

During a read operation, the column decoder 150 may transmit the data received through the data lines DL to the data input/output circuit 160.

The pass/fail check circuit 170 may receive the data from the read and write circuit 140, compare the data with an error-correctable range, and then output a pass or fail signal. When the semiconductor memory device 50 performs a program operation according to control of the memory controller 40 described in FIG. 2, a program verify operation is also performed with the program operation. During the program verify operation, the pass/fail check circuit 170 may count memory cells in which the program operation has failed, and determines whether the number of counted failed memory cells or the number of program error bits is within the error-correctable range. In the case where the number of program error bits is within the error-correctable range, then the program operation is determined as successful (i.e., determined as a pass). In the case where the number of program error bits is out of the error-correctable range, the program operation is determined as fail (i.e., determined as a fail).

The control logic 180 may control the voltage generator 130 and the read and write circuit 140 in response to the command CMD, and may control the row decoder 120 and the column decoder 150 in response to the address ADD. Further, the control logic 180 may transmit signals for a next operation to the voltage generator 130 and the read and write circuit 140 in response to the pass or fail signal.

For example, the control logic 180 may control a program operation and an erase operation of the semiconductor memory device 50 in response to the command CMD.

In accordance with embodiments of the present disclosure, each of the program operation and the erase operation may include a normal operation and a retry operation. For example, the semiconductor memory device 50 may perform a normal program operation, a normal erase operation, and a retry operation. Each of the normal program and normal erase operation may include normal operation loops that are performed under the control of the control logic 180. The retry operation may be performed when the normal operation loops fail even if a normal operation loop for a maximum operating pulse is performed. The retry operation may be the operation of repeating at least one of the normal operation loops.

The normal erase operation may include an erase step and an erase verify step. When the result of the erase verify step indicates a pass, the control logic 180 may terminate the erase operation without performing the retry operation. Before the normal erase loops reach a maximum erase pulse, the control logic 180 may control the peripheral circuit 110 so that, when the result of the erase verify step indicates a fail, a normal erase loop is re-performed by increasing the magnitude of the erase pulse.

The normal program operation may include a program step and a program verify step. When the result of the program verify step indicates a pass, the control logic 180 may terminate the program operation without performing the retry operation. Before the normal program loops reach a maximum program pulse, the control logic 180 may control the peripheral circuit 110 so that, when the result of the program verify step indicates a fail, a normal program loop is re-performed by increasing the magnitude of a program pulse.

Figure 4:
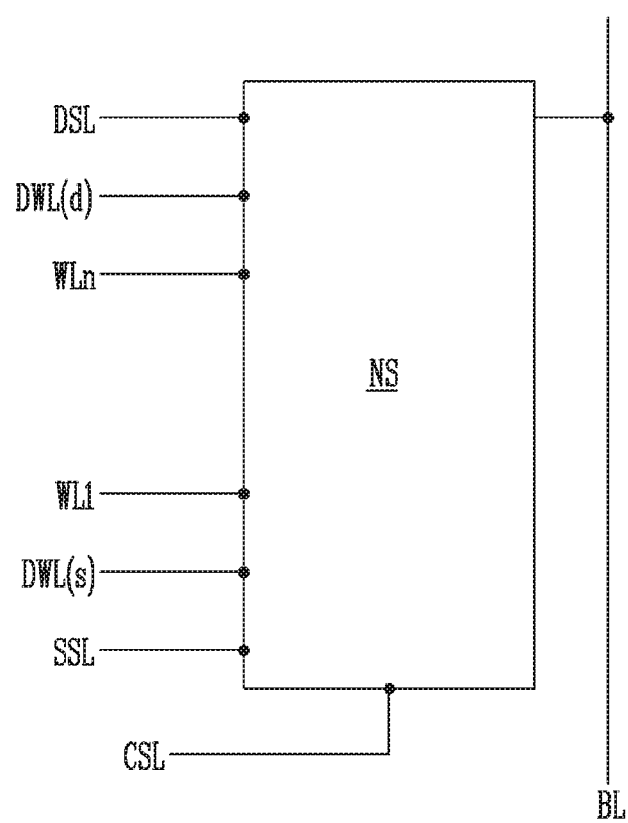
FIG. 4 is a diagram schematically illustrating conductive lines coupled to a cell string of a memory block according to an embodiment of the present disclosure.

FIG. 4 is a diagram schematically illustrating conductive lines coupled to a cell string NS of a memory block according to an embodiment of the present disclosure.

Referring to FIG. 4, the cell string NS is coupled between a bit line

BL and a common source line CSL. Gate electrodes of the cell string NS may be coupled to at least one source select line SSL, at least one drain select line DSL, one or more dummy word lines DWL, and a plurality of word lines WL1 to WLn. The dummy word lines may include at least one source-side dummy word line DWL(s) arranged between the source select line SSL and the plurality of word lines WL1 to WLn. The dummy word lines may include at least one drain-side dummy word line DWL(d) arranged between the drain select line DSL and the plurality of word lines WL1 to WLn.

Figure 5A:
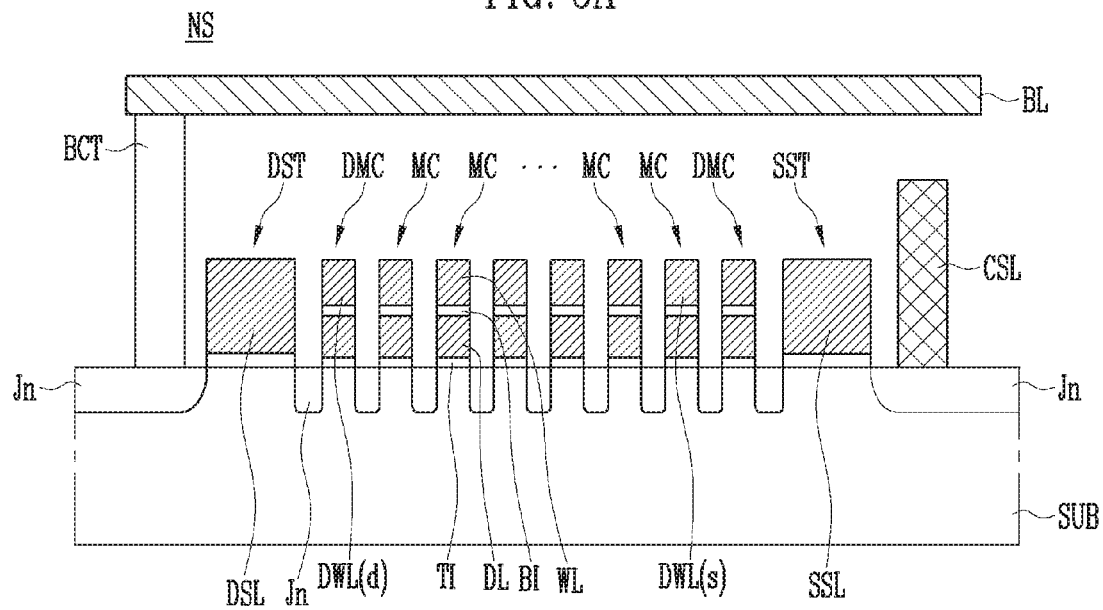
FIGS. 5A to 5C are sectional views illustrating the structures of various cell strings according to embodiments of the present disclosure.
Figure 5B:
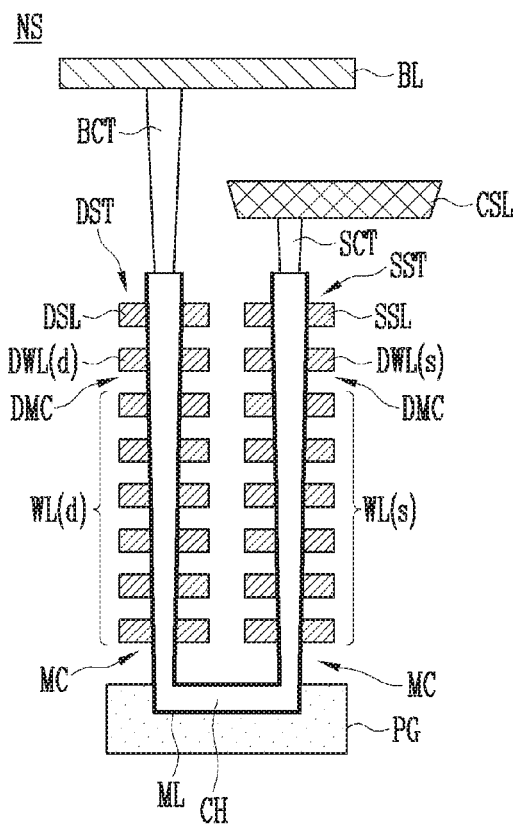
Figure 5C:
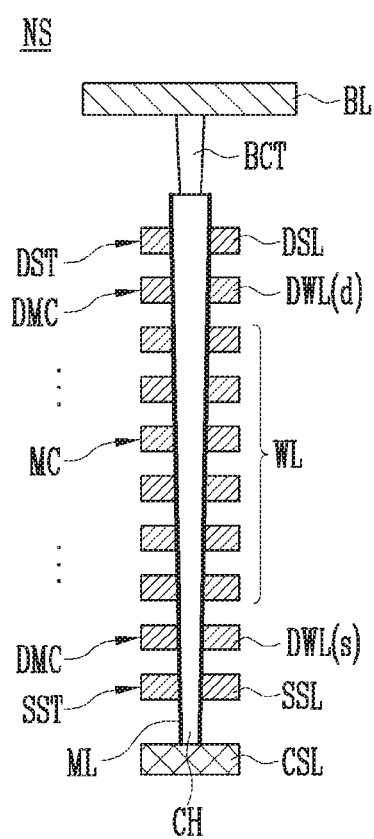

FIGS. 5A to 5C are sectional views illustrating the structures of various cell strings NS according to embodiments of the present disclosure.

Referring to FIGS. 5A to 5C, each of the cell strings NS includes a plurality of memory cells MC, at least one source select transistor SST, at least one drain select transistor DST, and one or more dummy cells DMC. The plurality of memory cells MC, the at least one source select transistor SST, the at least one drain select transistor DST, and the one or more dummy cells DMC may be connected in series. The source select transistor SST is coupled between the plurality of memory cells MC and a common source line CSL. The drain select transistor DST is coupled between the plurality of memory cells MC and a bit line BL. The dummy cells DMC may be arranged at least one of between the drain select transistor DST and the plurality of memory cells MC and between the source select transistor SST and the plurality of memory cells MC.

A gate of the source select transistor SST is coupled to a source select line SSL, a gate of the drain select transistor DST is coupled to a drain select line DSL, gates of the memory cells MC are coupled to word lines WL, and gates of the dummy cells DMC are coupled to dummy word lines DWL.

The bit line BL may be coupled to the cell string NS via a bit line contact plug BCT, or may be coupled to the cell string NS while being in direct contact with a channel layer CH or a drain junction of junction areas Jn. The common source line CSL may be coupled to the cell string NS via a source contact plug SCT, or may be coupled to the cell string NS while being in direct contact with the channel layer CH or a source junction of the junction areas Jn.

In accordance with an embodiment, the cell string NS may be formed in an active area of a substrate SUB, as illustrated in FIG. 5A. FIG. 5A illustrates the section of the cell string NS taken along the active area of the substrate SUB. The active area is used as the channel of the cell string NS.

Referring to FIG. 5A, the plurality of memory cells MC, the at least one source select transistor SST, and the at least one drain select transistor DST may be arranged along a first direction that is in parallel with the surface of the substrate SUB. Each of the plurality of memory cells MC, the at least one source select transistor SST, and the at least one drain select transistor DST includes junction areas Jn arranged on both sides of the gate thereof. The junction areas Jn are defined in the active area of the substrate SUB. The plurality of memory cells MC, the at least one source select transistor SST and the at least one drain select transistor DST may be coupled in series to each other through the junction areas Jn. Each of the junction areas Jn may be an area doped with n-type impurities.

The memory cells MC may be coupled to the word lines WL, respectively. Each of the memory cells MC may include a tunnel insulating layer TI, a data storage layer DL, and a blocking insulating layer BI which are sequentially stacked between the substrate SUB and the corresponding word line WL. The data storage layer DL may be formed of various layers such as a floating gate layer, a charge trap layer, and a layer containing nanodots. In detail, the floating gate layer may be formed of a polysil con layer, and the charge trap layer may be formed of a silicon nitride layer. The dummy cells DMC may have the same stack structure as the memory cells MC. The dummy cells DMC may be arranged at least one of between the source select transistor SST and the memory cells MC and between the drain select transistor DST and the memory cells MC. A gate of each dummy cell DMC is coupled to the corresponding dummy word line DWL.

A junction area Jn arranged on one side of the drain select transistor DST may be coupled to the bit line contact plug BCT, and may extend along a direction vertical to the surface of the substrate SUB. The bit line BL extending along the first direction may be coupled to the bit line contact plug BCT. A gate of the drain select transistor DST is coupled to the drain select line DSL.

A junction area Jn arranged on one side of the source select transistor SST may be coupled to the common source line CSL, and may extend along a direction vertical to the surface of the substrate SUB. A gate of the source select transistor SST is coupled to the source select line SSL.

In accordance with other embodiments, the cell string NS may be further coupled to a pipe gate PG, as illustrated in FIG. 5B.

Referring to FIG. 5B, the cell string NS may include memory cells MC corresponding to at least two columns stacked on the pipe gate PG. The pipe gate PG may be an area injected with impurities in the substrate or a doped semiconductor layer or a conductive layer arranged on the substrate. The cell string NS may be coupled to drain-side gate lines and source-side gate lines which are stacked on the pipe gate PG while being spaced apart from each other.

The drain-side gate lines may be formed in the same stack structure as the source-side gate lines, and may be spaced apart from the source-side gate lines. The drain-side gate lines may include drain-side word lines WL(d), a drain-side dummy word line DWL(d), and a drain select line DSL which are stacked on the pipe gate PG while being spaced apart from each other. The source-side gate lines may include source-side word lines WL(s), a source-side dummy word line DWL(s), and a source select line SSL which are stacked on the pipe gate PG while being spaced apart from each other.

The channel layer CH of the cell string NS may include pillar parts which extend to penetrate through the drain-side gate lines and the source-side gate lines, respectively, and a coupling part which is embedded in the pipe gate PG so as to couple the pillar parts. The end of one of the pillar parts is coupled to the bit line BL, and the end of the remaining one of the pillar parts is coupled to the common source line CSL. The channel layer CH is used as the channel of the cell string NS.

In accordance with an embodiment, the cell string NC may include a channel layer CH coupled to a common source line CSL and extended along one direction, as illustrated in FIG. 5C. The common source line CSL may be an area formed by injecting n-type impurities into the surface of a semiconductor substrate. Alternatively, the common source line CSL may be a doped semiconductor layer or a conductive layer arranged on the substrate.

Referring to FIG. 5C, the top of the channel layer CH is coupled to a bit line BL, and the bottom of the channel layer CH is coupled to the common source line CSL. The cell string NS is coupled to a source select line SSL, a source-side dummy word line DWL(s), word lines WL, a drain-side dummy word line DWL(d), and a drain select line DSL which are stacked between the common source line CSL and the bit line BL while being spaced apart from each other.

The channel layer CH of the cell string NS penetrates through the source select line SSL, the source-side dummy word line DWL(s), the word lines WL, the drain-side dummy word line DWL(d), and the drain select line DSL.

Referring to FIGS. 5B and 5C, each of the cell strings NS includes a multilayer memory layer ML enclosing the outer wall of the channel layer CH corresponding thereto. The multilayer memory layer ML may include a data storage layer which can store data. The multilayer memory layer ML may further include a tunnel insulating layer arranged between the data storage layer and the channel layer. The multilayer memory layer ML may further include a blocking insulating layer extending along the outer wall of the data storage layer.

The memory cells MC are formed at intersections between the word lines WL and the channel layer CH, the dummy cells DMC are formed at intersections between the dummy word lines DWL and the channel layer CH, the source select transistor SST is formed at an intersection between the source select line SSL and the channel layer CH, and the drain select transistor DST is formed at an intersection between the drain select line DSL and the channel layer CH.

The cell string NS may be formed in various structures other than the above structures described in FIGS. 5A to 5C.

The memory cells MC in each of the above-described cell strings NS may be programmed using an incremental step pulse program (ISPP) scheme. The memory cells MC in each of the cell strings NS may be erased using an incremental step pulse erase (ISPE) scheme. As the number of program/erase cycles increases, respective threshold voltages of the dummy cells DMC, the source select transistor SST, and the drain select transistor DST may increase. Thus, the failure rate of a normal program operation or a normal erase operation may increase. Embodiments of the present disclosure provide various examples of retry operations which are capable of overcoming the characteristic degradation of the semiconductor memory device caused by an increase in threshold voltage.

Figure 6A:
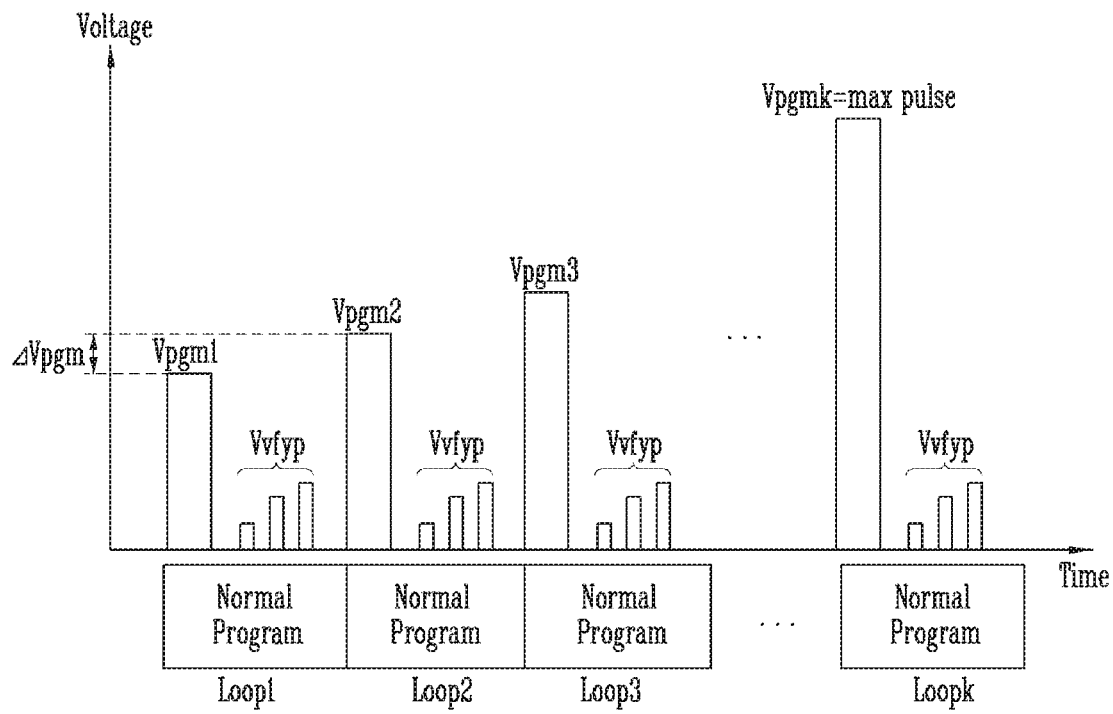
FIGS. 6A and 6B are diagrams illustrating an example of a normal operation based on an incremental step pulse program (ISPP) scheme.
Figure 6B:
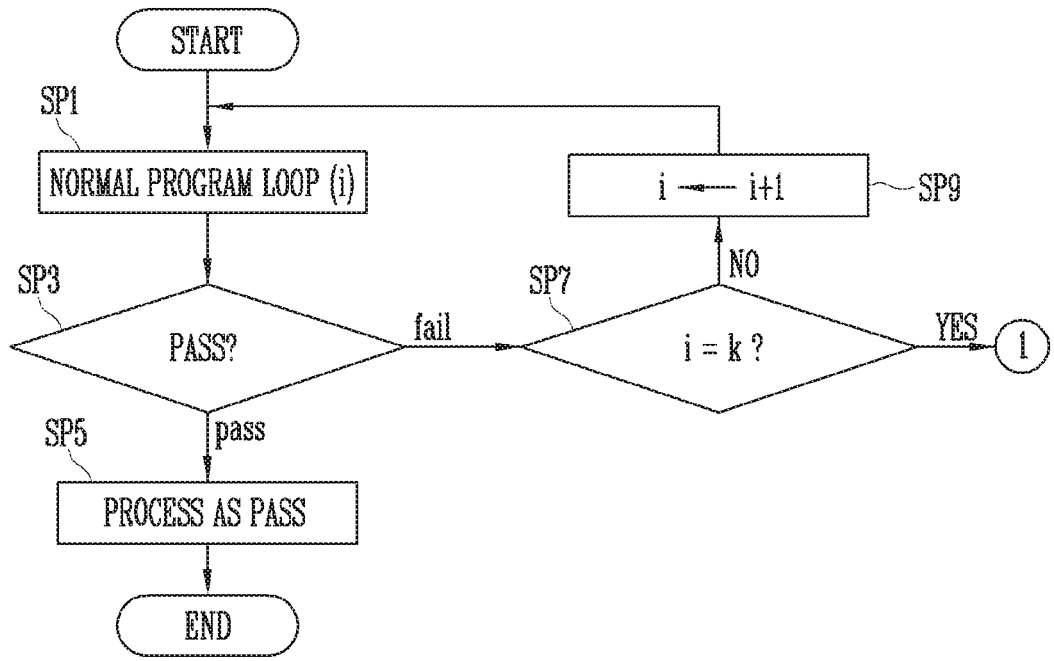

FIGS. 6A and 6B are diagrams illustrating an example of a normal operation based on an incremental step pulse program (ISPP) scheme. In detail, FIG. 6A is a diagram illustrating program operation loops included in a normal program operation based on the ISPP scheme, and FIG. 6B is a flowchart illustrating a normal program operation based on the ISPP scheme.

Referring to FIG. 6A, the normal program operation according to the embodiment of the present disclosure may be performed based on the ISPP scheme. In detail, the normal program operation may include a plurality of normal program loops Loop 1 to Loop k. Each of the plurality of normal program loops Loop 1 to Loop k includes a program step at which an operating voltage corresponding to a given loop, among program voltages Vpgm1 to Vpgmk, is applied, and a program verify step at which at least one program verify voltage Vvfyp is applied.

The program step may be performed in order to change the states of the memory cells coupled to the selected word line to programmed states by increasing the threshold voltages of the memory cells. The program verify step may be performed so as to determine whether the threshold voltages of the memory cells changed at the program step have reached program target voltages.

The program voltage, which is an operating voltage for programming, is increased by a program step voltage LVpgm whenever the number of normal program loops for the normal program operation is increased. The number of normal program loops for the normal program operation may be set to a maximum value of k. In this case, the program voltage used in the normal program operation is sequentially increased from a first program pulse Vpgm1 to a k-th program pulse Vpgmk, which is the maximum program pulse, by a program step voltage ΔVpgm. The normal program operation is performed within a limited number of loops ranging from the first normal program loop Loop 1 based on the first program pulse Vpgm1 to the k-th normal program loop Loop k based on the k-th program pulse Vpgmk. Until the threshold voltage of a selected memory cell reaches the program target voltage, the normal program loops Loop 1 to Loop k are sequentially performed.

The number of program verify voltages Vvfyp used at the program verify step may be variously set depending on the data storage unit of the semiconductor device. Although FIG. 6A is illustrated on the assumption that the semiconductor memory device includes multi-level cells, each of which stores three bits of data, the embodiment of the present disclosure is not limited thereto. In other words, the data storage unit of the semiconductor memory device may be changed in various manners.

When a program command and an address are received, a cell string selected by the received address may perform a normal program operation based on voltage conditions given in the following Table 1.

TABLE 1

|  | program | program verify |
|---|---|---|
| BL | Vss | Vppre |
| DSL | Von1 | Vpread1 |
| Selected WL | Vpgm | Vvfyp |
| Unselected WL | Vpass1 | Vpread2 |
| SSL | Voff1 | Vpread3 |
| DWL | Vpass2 | Vpread4 |

Referring to Table 1, during a program operation, a ground voltage Vss may be supplied to a selected bit line BL, a first turn-on voltage Von1 may be supplied to a selected drain select line DSL, a program voltage Vpgm may be supplied to a selected word line WL, a first pass voltage Vpass1 may be supplied to unselected word lines WL, a first turn-off voltage Voff1 may be supplied to a selected source select line SSL, and a second pass voltage Vpass2 may be supplied to the dummy word line DWL. The first turn-on voltage Von1 may be a supply voltage. The first turn-off voltage Voff1 may be a ground voltage. The first pass voltage Vpass1 and the second pass voltage Vpass2 may be equal to or different from each other. The program voltage Vpgm may be any one of the program voltages Vpgm1 to Vpgmk illustrated in FIG. 6A.

During a program verify operation, a precharge voltage Vppre may be supplied to a selected bit line BL, and program read voltages Vpread1 to Vpread4 may be supplied to a selected drain select line DSL, unselected word lines WL, a selected source select line SSL, and the dummy word line DWL, respectively. The first program read voltage Vpread1 supplied to the selected drain select line DSL may be a turn-on voltage. The second program read voltage Vpread2 supplied to the unselected word lines WL may be a read pass voltage. The third program read voltage Vpread3 supplied to the selected source select line SSL may be a turn-on voltage. The fourth program read voltage Vpread4 supplied to the dummy word line DWL may be a read pass voltage. During the program verify operation, the program verify voltage Vvfyp is supplied to the selected word line WL.

When the program step is performed based on the voltage conditions given in Table 1, each memory cell coupled to the selected word line WL may be programmed via a Fowler-Nordheim (FN) tunneling phenomenon induced by the program voltage Vpgm.

The program verify voltage Vvfyp, applied at the program verify step, is used to determine whether the threshold voltage of the memory cell has reached the target threshold voltage, and may be either a single verify voltage or a series of verify voltages that are sequentially increased.

Table 1 shows an example of voltage setting conditions for the normal program operation, and the operating voltages for the normal program operation according to the present disclosure are not limited thereto. For example, for the normal program operation, a predetermined voltage may be applied to the common source line at the program step, and in this case, a turn-on voltage may be applied to the source select line.

Referring to FIG. 6B, when a program command and an address are received to initiate a program operation, a first normal program loop at i=1 is performed on a selected memory cell at step SP1. "i" in FIG. 6B may indicate the turn, i.e., order of the normal program loop (which may also be referred to as "order (i)") of the corresponding normal program loop. Thereafter, at step SP3, whether the normal program loop performed at step SP1 has passed or failed is determined.

When the result of determination at step SP3 indicates a pass, the program operation performed on a selected page may be processed as a pass and be terminated. For example, when all of the threshold voltages of selected memory cells in the selected page are increased to program target voltages, the result of determination at step SP3 indicates a pass, and then the program operation on the selected page may be processed as a pass at step SP5, and be terminated.

When a memory cell, the threshold voltage of which does not reach a program target voltage, is present among the memory cells in the selected page, the result of determination at step SP3 may indicate a fail. When the result of determination at step SP3 indicates a fail, whether the order (i) of the normal program loop performed at step SP1 has reached the last order k of the normal program loop is determined at step SP7. When it is determined at step SP7 that the order (i) of the just previously performed normal program loop has not reached the last order k (that is, NO at step SP9), the order (i) of the normal program loop is increased by 1 at step SP9. Steps SP1, SP3, SP7 and SP9 may then be repeatedly performed, until the result of determination indicates a pass at step SP3.

When it is determined at step SP7 that the order (i) of the normal program loop has reached the last order k (that is, YES at step SP7), a retry operation may be subsequently performed. In other words, when the k-th normal program loop (i.e., normal program loop k of FIG. 6A) based on the k-th program pulse (i.e., Vpgmk of FIG. 6A), which corresponds to the maximum program operating pulse for the normal program operation, fails, the retry operation may be subsequently performed. That is, even if the normal program loops ranging from the first normal program loop to the k-th normal program loop are sequentially performed, the retry operation is performed when the normal program operation fails.

The normal program operation illustrated in FIG. 6B is performed based on the voltages at initially set levels.

Figure 7A:
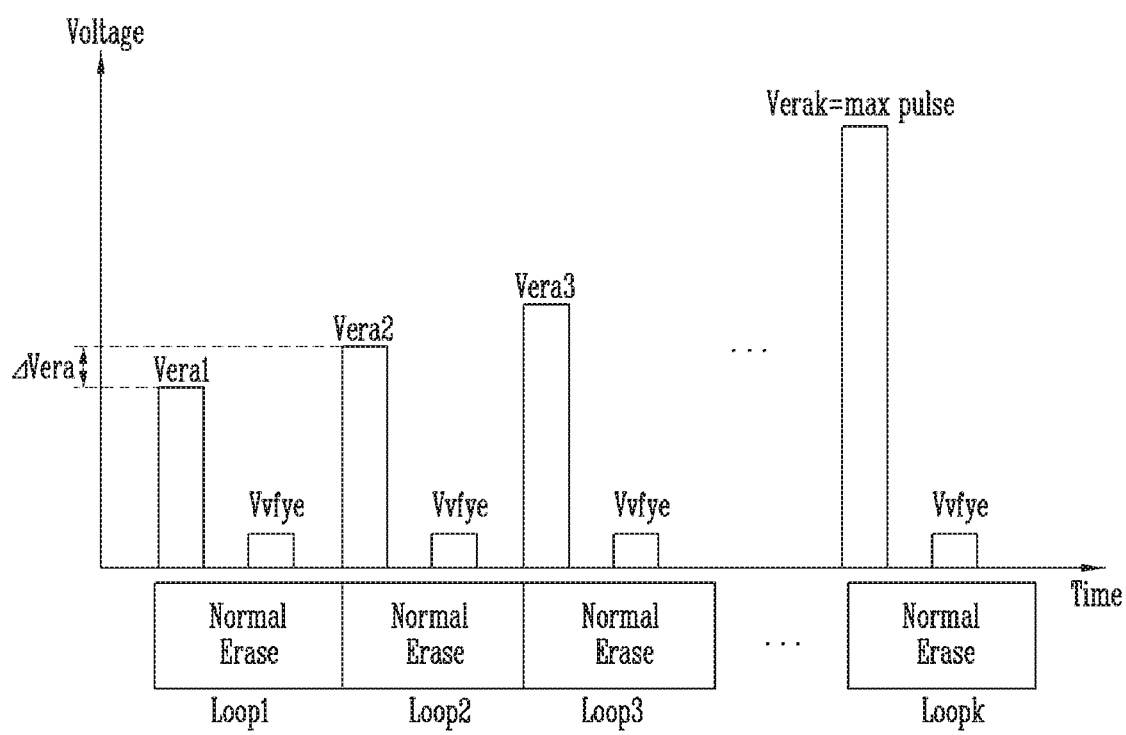
FIGS. 7A to 7C are diagrams illustrating an example of a normal operation based on an incremental step pulse erase (ISPE) scheme.
Figure 7B:
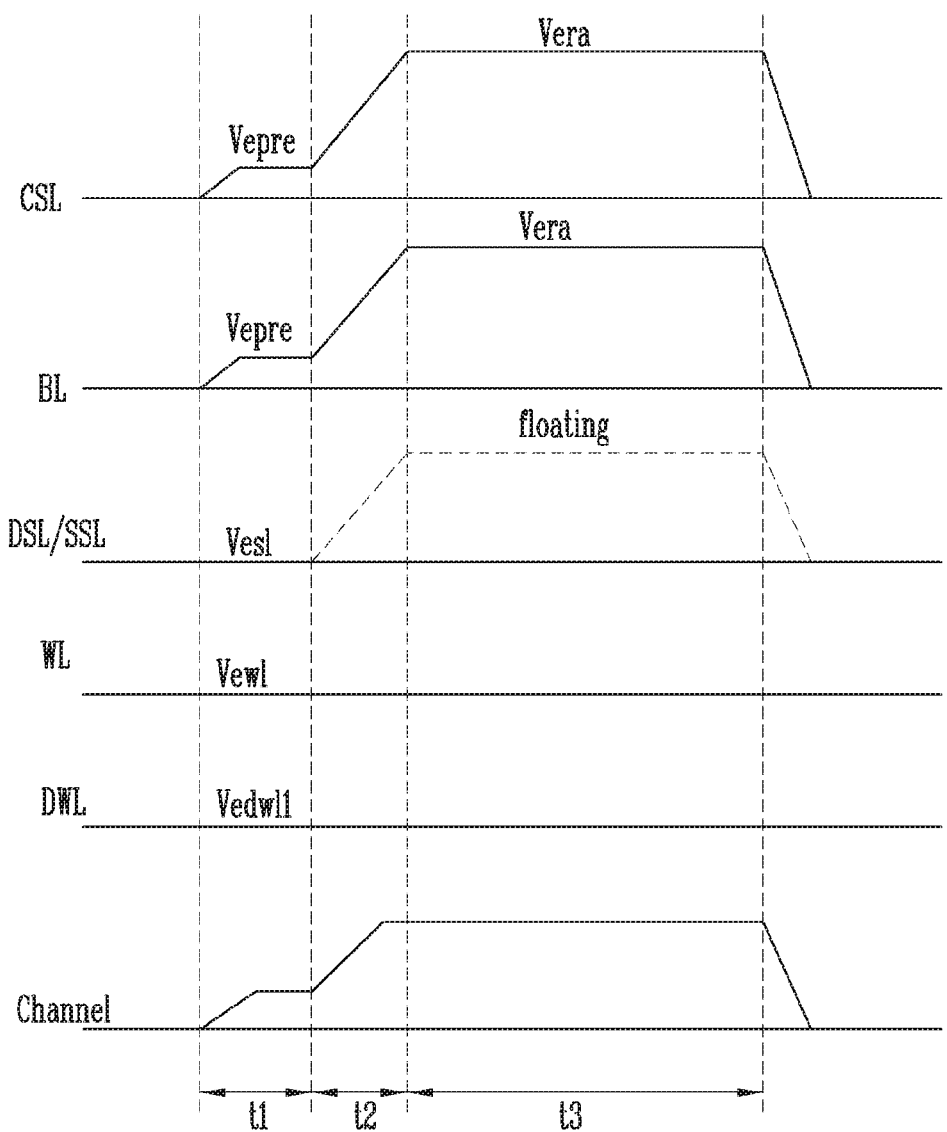
Figure 7C:
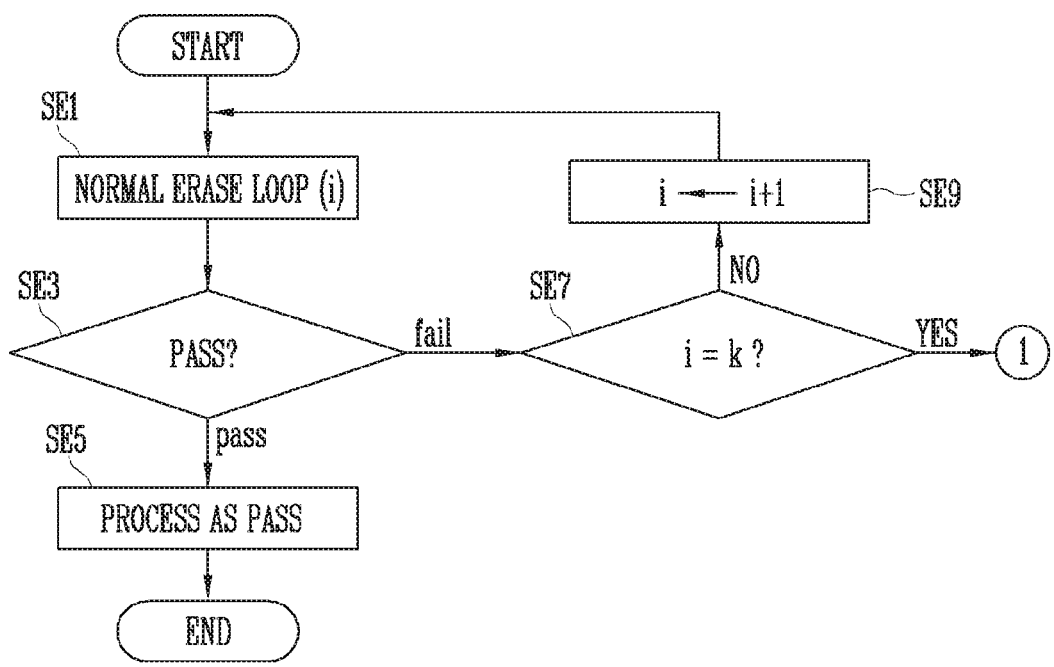

FIGS. 7A to 7C are diagrams illustrating an example of a normal operation based on an incremental step pulse erase (ISPE) scheme. In detail, FIG. 7A is a diagram illustratively illustrating erase operation loops included in a normal erase operation based on the ISPE scheme. FIG. 7B is a waveform diagram for explaining respective erase steps of erase operation loops. FIG. 7C is a flowchart illustrating the normal erase operation based on the ISPE scheme.

Referring to FIG. 7A, the normal erase operation according to the embodiment of the present disclosure may be performed based on the ISPE scheme. The normal erase operation may include a plurality of normal erase loops Loop 1 to Loop k. Here, the value of k may be an arbitrary value different from the value of k of the normal program loop. Each of the plurality of normal erase loops Loop 1 to Loop k includes an erase step which is performed based on an operating voltage corresponding to a given loop, among erase voltages Vera1 to Verak, and an erase verify step which is performed based on an erase verify voltage Vvfye.

The erase step may be performed in order to change the states of the memory cells included in the selected memory block to erased states by decreasing the threshold voltages of the memory cells. For this operation, at the erase step, an erase voltage may be applied to a common source line. The erase verify step may be performed so as to determine whether the threshold voltages of the selected memory cells have reached erase target voltages.

The erase voltage, which is an operating voltage for the erase operation, is increased by an erase step voltage $\Delta$Vera whenever the number of normal erase loops for the normal erase operation increases. The number of normal erase loops of the normal erase operation may be set to a maximum value of k. In this case, the erase voltage used in the normal erase operation is sequentially increased from a first erase pulse Vera1 to a k-th erase pulse Verak, which is the maximum erase pulse, by an erase step voltage $\Delta$Vera. The normal erase operation is performed within a limited number of loops ranging from a first normal erase loop Loop 1 based on the first erase pulse Vera1 to a k-th normal erase loop Loop k based on the k-th erase pulse Verak. Until the threshold voltages of the selected memory cells reach the erase target voltages, the normal erase loops Loop 1 to Loop k are sequentially performed.

The erase verify voltage Vvfye applied during the erase verify operation is used to determine whether the threshold voltages of the memory cells have reached erase target voltages.

Referring to FIG. 7B, the erase step of each of the normal erase loops may include first to third intervals t1 to t3.

During the first interval t1, a precharge voltage Vepre is applied to the common source line CSL, and a select voltage Vesl is applied to each of a drain select line DSL and a source select line SSL. The select voltage Vesl may be 0 V, and the precharge voltage Vepre may be a positive voltage higher than 0 V. Here, the precharge voltage Vepre may be applied to the bit line BL. During the first interval t1, a word line voltage Vewl is applied to the word lines WL of a selected memory block, and a first dummy word line voltage Vedwl1 is applied to the dummy word line DWL of the selected memory block. For example, the word line voltage Vewl and the first dummy word line voltage Vedwl1 may be 0 V.

During the first interval t1, gate induced drain leakage (GIDL) occurs due to the precharge voltage Vepre, and hot holes are injected into the channel of the cell string due to GIDL. Thus, the potential of the channel increases.

Next, the drain select line DSL and the source select line SSL are caused to float, and the precharge voltage Vepre applied to the common source line CSL is increased to the erase voltage Vera during a second interval t2. The erase voltage Vera may be a positive voltage higher than the precharge voltage Vepre, and may correspond to, for example, the level of any one of the erase pulses illustrated in FIG. 7A. Here, the potentials of the drain select line DSL and the source select line SSL are increased by coupling between the channel and the drain select line DSL and coupling between the channel and source select line SSL. Further, the potential level of the channel is further increased. Even during the second interval t2, the word line voltage Vewl and the first dummy word line voltage Vedwl1 may be maintained at the same levels as those during the first interval t1.

Thereafter, even during a third interval t3 in which the erase voltage Vera is maintained, the word line voltage Vewl and the first dummy word line voltage Vedwl1 may be maintained at the same levels as those during the second interval t2. Here, the memory cells are erased due to potential differences between respective word lines WL and the channel.

When the third interval t3 is maintained for a predetermined period of time, the erase voltage Vera applied to the common source line CSL is discharged to a ground level, after which the erase verify step may be performed.

Referring to FIG. 7C, when an erase command and an address are received to initiate an erase operation, a first normal erase loop at i=1 is performed on a selected memory block at step SE1. "i" in FIG. 7C may indicate the turn, i.e., order of a normal erase loop (which may also be referred to as "order (i)") of the corresponding normal erase loop. Thereafter, whether the normal erase loop performed at step SE1 has passed is determined at step SE3.

When the result of determination at step SE3 indicates a pass, the erase operation performed on the selected memory block may be processed as a pass and be terminated. For example, when the threshold voltages of respective memory cells included in the selected memory block are decreased to erase target voltages, the result of determination at step SE3 indicates a pass, and the erase operation performed on the selected memory block may be processed as a pass at step SE5 and be terminated.

When a memory cell, the threshold voltage of which is not decreased to an erase target voltage, is present among the memory cells included in the selected memory block, the result of determination at step SE3 may indicate a fail. When the result of determination at step SE3 indicates a fail, whether the order (i) of the normal erase loop performed at step SE1 has reached the last order k of the normal erase loop is determined at step SE7. When it is determined at step SE7 that the order (i) of the normal erase loop performed at the previous step has not reached the last order k (in case of No), the order (i) of the normal erase loop is increased by 1 at step SE9. Steps SE1, SE3, SE7, and SE9 may then be repeated until the result of determination at step SE3 indicates a pass.

When it is determined at step SE7 that the order (i) of the normal erase loop performed at the previous step has reached the last order k (that is, YES at step SE7), a retry operation is subsequently performed. In other words, when the k-th normal erase loop (i.e., normal erase loop k) based on the k-th erase pulse (i.e., Verak of FIG. 7A), which corresponds to the maximum erase voltage for the normal erase operation, fails, the retry operation may be subsequently performed. That is, even if the normal erase loops ranging from the first normal erase loop to the k-th normal erase loop are sequentially performed, the retry operation is performed when the normal erase operation fails.

The normal erase operation illustrated in FIG. 7C may be performed based on initially set voltages.

When the number of program/erase cycles increases, the threshold voltages of the source select transistor SST, the drain select transistor DST, and the dummy cell DMC that constitute each of cell strings (i.e., NS of FIGS. 5A to 5C) may increase. When the threshold voltages of the source select transistor SST, the drain select transistor DST, and the dummy cell DMC excessively increase, the probability that the normal operation will fail may increase. The embodiments of the present disclosure may provide various retry operations that are capable of changing the fail state of the normal operation attributable to the source select transistor SST, the drain select transistor DST, and the dummy cell DMC, which are degraded with the increase in the number of program/erase cycles, to a pass state.

FIGS. 8A to 8D are flowcharts illustrating retry operations of a memory device according to embodiments of the present disclosure. FIGS. 8A to 8D illustrate subsequent processes to be performed when the normal operation of FIG. 6B or 7C is determined to have failed, as described with reference to FIGS. 6B and 7C (that is, when YES at step SP7 or SE7, respectively). Pass/fail results for the normal operation may be determined after the completion of all of the normal operation loops that are performed based on operating voltages which are sequentially increased by a step voltage from the first operating pulse Vpgm1 or Vera1 to the k-th operating pulse Vpgmk or Verak, as illustrated in FIG. 6A or 7A.

Figure 8A:
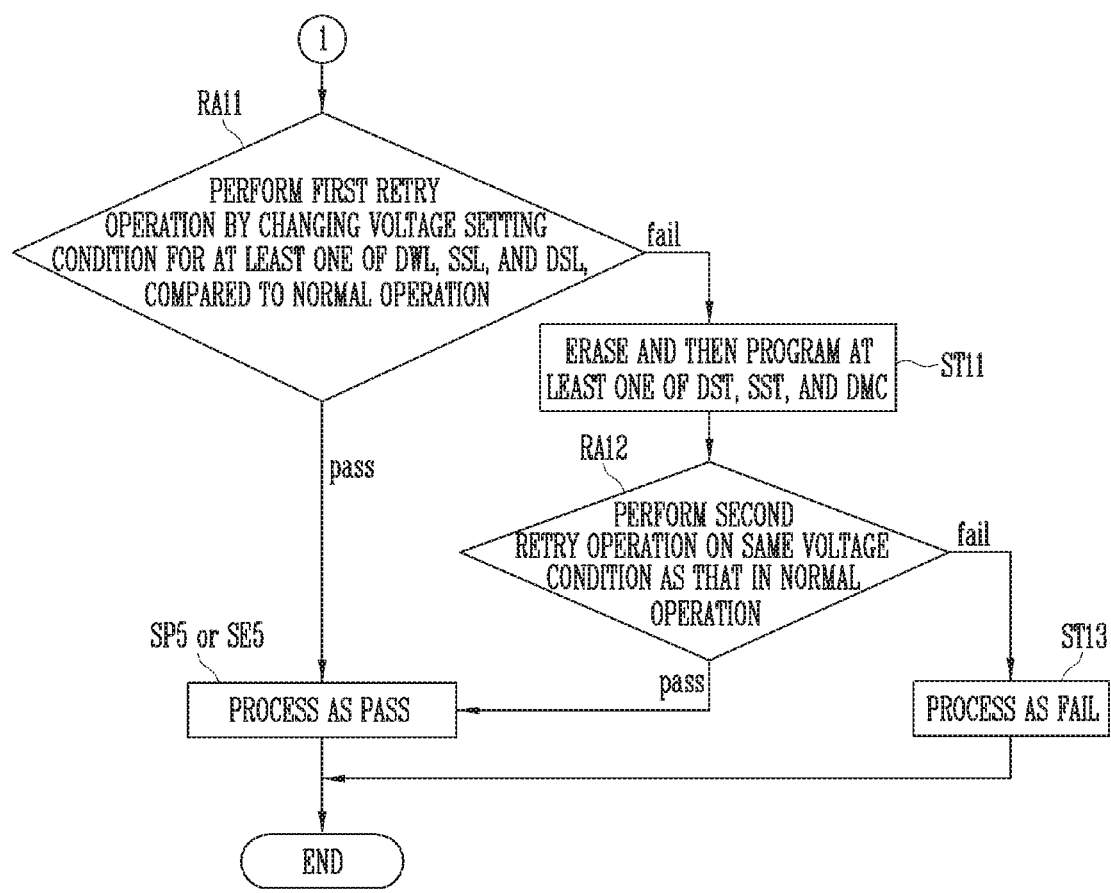
FIGS. 8A to 8D are flowcharts illustrating retry operations of a memory device according to embodiments of the present disclosure.

Referring to FIG. 8A in which an example of the present disclosure is depicted, retry operations may include a first retry operation performed at step RA11. Step RA11 may be performed after the normal operation is determined to have failed, as described with reference to FIGS. 6B and 7C.

By means of the first retry operation, at least one of normal operation loops ranging from an i-th (where $1<i\leq k$) normal operation loop Loop i (where Loop $1<$Loop i$\leq$Loop k) based on an i-th operating pulse to a k-th normal operation loop Loop k based on a k-th operating pulse, which is the maximum operating pulse, is repeated. In detail, the first retry operation may be performed within a limited number of loops ranging from the i-th normal operation loop to the k-th normal operation loop. Also, the first retry operation may include the step of repeatedly and sequentially performing normal operation loops from the i-th normal operation loop, which is described above with reference to FIG. 6A or 7A, by increasing the operating voltage by a step voltage until the threshold voltage of a selected memory cell reaches a target threshold voltage.

When the first retry operation is performed, a voltage setting condition for at least one of a dummy word line DWL coupled to a dummy cell DMC, a source select line SSL coupled to a source select transistor SST, and a drain select line DSL coupled to a drain select transistor DST is changed compared to the normal operation. The voltage setting condition may include a voltage level and the length of an interval during which a specific voltage is maintained and applied. A scheme for changing the voltage setting condition may be controlled in various manners. By means of the change in the voltage setting condition, the embodiments of the present disclosure may change the normal operation, which is determined to have failed because of the threshold voltages of the dummy cell DMC, the source select transistor SST, and the drain select transistor DST that are increased due to the increase in the number of program/erase cycles, to a programmed state.

When the result of step RA11 of performing the first retry operation indicates a pass, the process proceeds to step SP5 illustrated in FIG. 6B or step SE5 illustrated in FIG. 7C depending on the type of re-performed operation. For example, when normal program loops for the normal program operation are repeated in the first retry operation, and then the repeated normal program loops have passed, the process proceeds to step SP5, described in FIG. 6B, after the first retry operation.

When step RA11 for performing the first retry operation fails, at least one of the drain select transistor DST, the source select transistor SST, and the dummy cell DMC is erased and then programmed at step ST11. A fail at step RA11 may correspond to a case where the k-th normal operation loop for the k-th operating pulse, among the normal operation loops, fails.

Respective threshold voltages of the drain select transistor DST, the source select transistor SST, and the dummy cell DMC, which are erased and then programmed, may be reset to initial threshold voltages. In other words, changes in the threshold voltages of the dummy cell DMC, the source select transistor SST, and the drain select transistor DST attributable to the increase in the number of program/erase cycles may be compensated for at step ST11.

The retry operation includes a second retry operation performed at step RA12 after step ST11.

At least one of the normal operation loops, described with reference to FIG. 6A to 7A, may be repeated by the second retry operation. In detail, the second retry operation may include repeatedly and sequentially performing normal operation loops ranging from the first normal operation loop Loop 1, described above with reference to FIG. 6A or 7A, by increasing the operating voltage by a step voltage until the threshold voltage of a selected memory cell reaches a target threshold voltage within k limited loops.

When the second retry operation is performed, voltage setting conditions for the dummy word line DWL coupled to the dummy cell DMC, the source select line SSL coupled to the source select transistor SST, and the drain select line DSL coupled to the drain select transistor DST are the same as those in the normal operation.

When the result of step RA12 of performing the second retry operation indicates a pass, the process proceeds to step SP5 illustrated in FIG. 6B or step SE5 illustrated in FIG. 7C depending on the type of re-performed operation (for instance, program or erase).

When the result of step RA12 of performing the second retry operation indicates a fail, the normal operation is processed as a fail at step ST13. The second retry operation is performed after at least one of the threshold voltages of the drain select transistor DST, the source select transistor SST, and the dummy cell DMC has been reset. Therefore, the operations of the dummy cell DMC, the source select transistor SST, and the drain select transistor DST which are degraded due to the increase in the number of program/erase cycles may be improved. As a result, the probability that the program operation or erase operation will fail due to the increase in the number of program/erase cycles may be reduced.

Figure 8B:
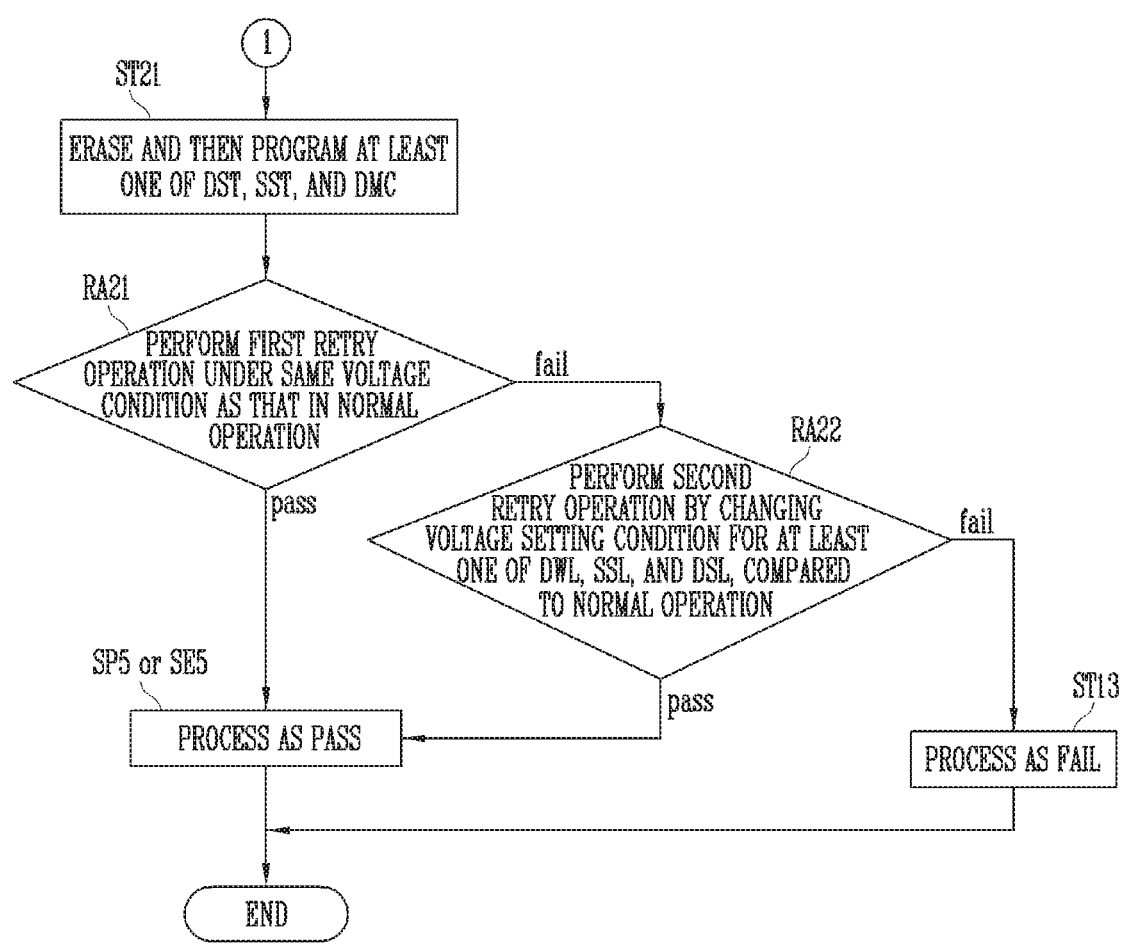

Referring to FIG. 8B in which an example of the present disclosure is depicted, the process proceeds to step ST21 after the normal operation is determined to have failed, as described with reference to FIGS. 6B and 7C (that is, when YES at step SP7 or SE7, respectively). Step ST21 is identical to step ST11 described with reference to FIG. 8A.

In accordance with the present embodiment, the retry operation includes a first retry operation performed at step RA21 subsequent to step ST21. Step RA21 is identical to step RA12 described with reference to FIG. 8A.

When the result of step RA21 of performing the first retry operation indicates a pass, the proceeds to step SP5 illustrated in FIG. 6B or step SE5 illustrated in FIG. 7C depending on the type of re-performed normal operation (for instance, program or erase).

When the result of step RA21 of performing the first retry operation indicates a fail, the retry operation includes a second retry operation performed at step RA22. The second retry operation is identical to that of step RA11 described with reference to FIG. 8A.

When the result of step RA22 of performing the second retry operation indicates a pass, the process proceeds to step SP5 illustrated in FIG. 6B or step SE5 illustrated in FIG. 7C depending on the type of re-performed normal operation.

When step RA22 of performing the second retry operation fails, the normal operation is processed as a fail at step ST13.

Figure 8C:
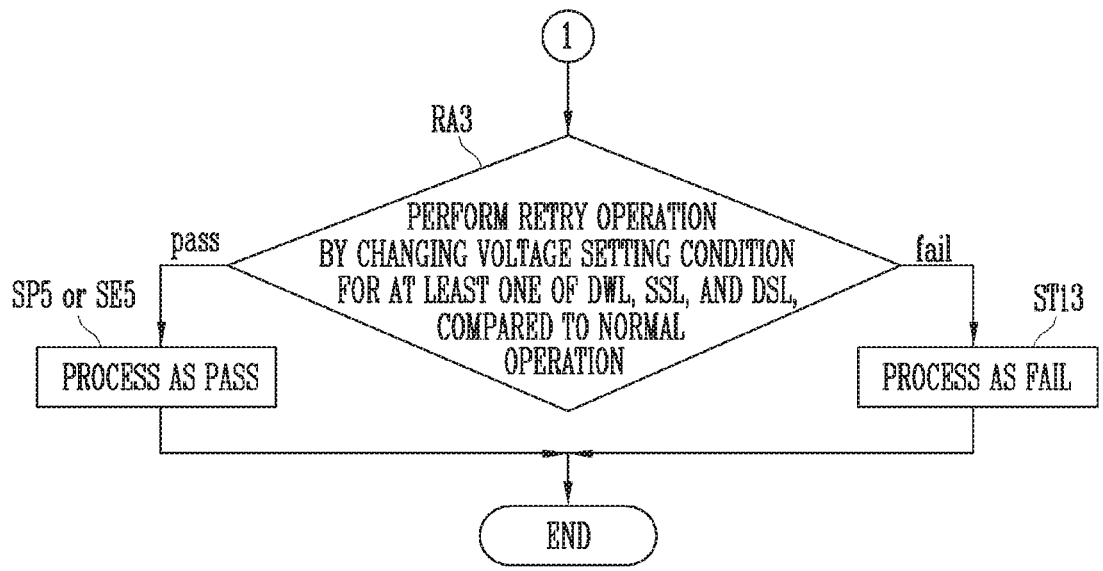

Referring to FIG. 8C in which an example of the present disclosure is depicted, the process proceeds to step RA3 of performing a retry operation after the normal operation is determined to have failed, as described with reference to FIGS. 6B and 7C (that is, when YES at step SP7 or SE7, respectively). Step RA3 is identical to RA11 described with reference to FIG. 8A.

When the result of step RA3 indicates a pass, the process proceeds to step SP5 illustrated in FIG. 6B or step SE5 illustrated in FIG. 7C depending on the type of re-performed operation (for instance, program or erase).

When the result of step RA3 indicates a fail, the normal operation is processed as a fail at step ST13.

Figure 8D:
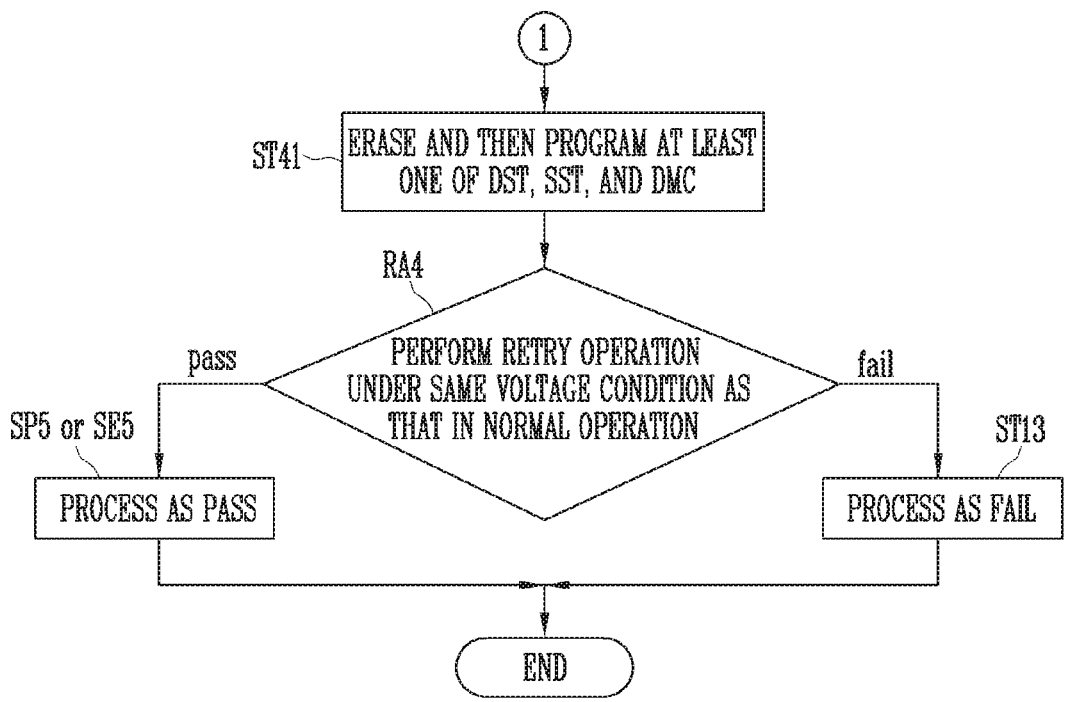

Referring to FIG. 8D in which an example of the present disclosure is depicted, the process proceeds to step ST41 after the normal operation is determined to have failed, as described with reference to FIGS. 6B and 7C. Step ST41 is identical to step ST11 described with reference to FIG. 8A.

In accordance with the present disclosure, the retry operation may be performed at step RA4 subsequent to step ST41. Step RA4 is identical to step RA12 described with reference to FIG. 8A.

When the result of step RA4 indicates a pass, the process proceeds to step SP5 illustrated in FIG. 6B or step SE5 illustrated in FIG. 7C depending on the type of re-performed operation (for instance, program or erase).

When the result of step RA4 indicates a fail, the normal operation is processed as a fail at step ST13.

Figure 9A:
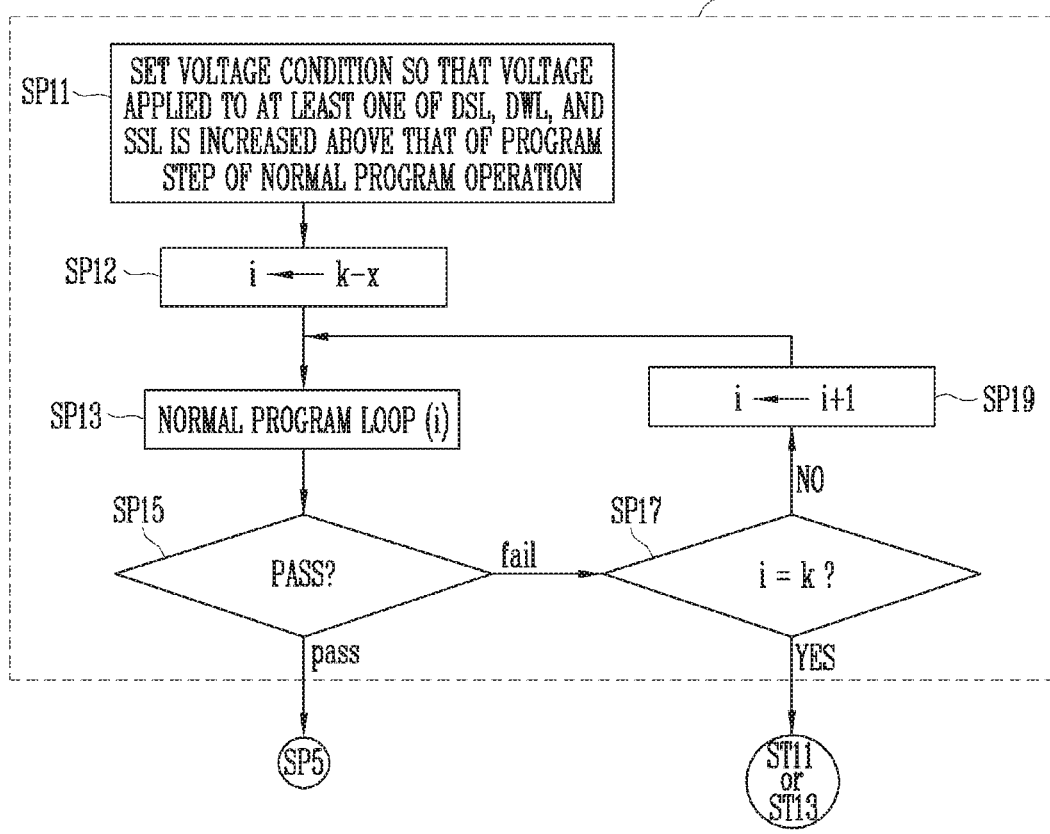
FIGS. 9A and 9B are flowcharts illustrating retry operations based on the ISPP scheme.
Figure 9B:
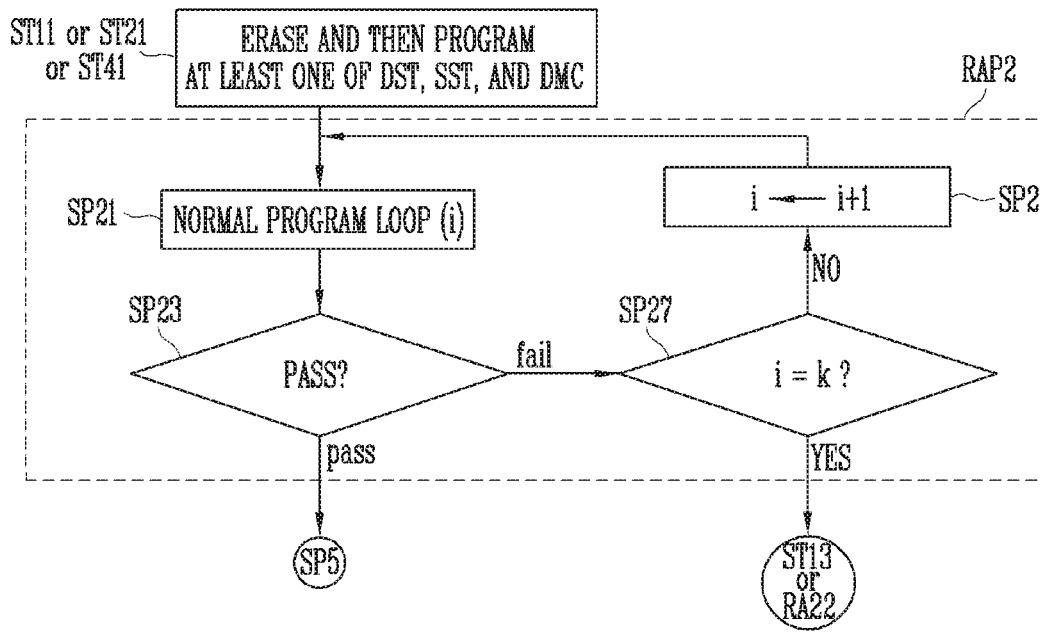

FIGS. 9A and 9B are flowcharts illustrating retry operations based on the ISPP scheme. FIGS. 9A and 9B are associated with the retry operations to be performed when the normal program operation is determined to have failed as described with reference to FIG. 6B. In detail, a retry operation RAP1 illustrated in FIG. 9A may be applied to step RA11 of FIG. 8A, step RA22 of FIG. 8B, and step RA3 of FIG. 8C. The retry operation RAP2 illustrated in FIG. 9B may be applied to step RA12 of FIG. 8A, step RA21 of FIG. 8B, and step RA4 of FIG. 8D.

Referring to FIG. 9A, the retry operation RAP1 is configured to set a voltage condition so that the voltage of at least one of a drain select line DSL, a dummy word line DWL, and a source select line SSL, which are coupled to a selected cell string, is increased above that of the normal program operation at step SP11. For example, the program step of the normal program operation may be performed using the voltages exemplified in Table 1. In this case, the voltage of the drain select line DSL at step SP11 may be set to a second turn-on voltage higher than a first turn-on voltage Von1 exemplified in Table 1. Alternatively, the voltage of the dummy word line DWL at step SP11 may be set to a third pass voltage higher than a second pass voltage Vpass2 exemplified in Table 1.

Unlike the case exemplified in Table 1, when the program step of the normal program operation is performed by applying a turn-on voltage to the source select line SSL, a voltage condition may be set such that the turn-on voltage applied to the source select line SSL is increased above that of the program step of the normal program operation.

When the threshold voltage of any one of a source select transistor, a drain select transistor, and a dummy cell is excessively increased due to the increase in the number of program/erase cycles, the potential of the channel of the source select transistor, the drain select transistor, or the dummy cell, the threshold voltage of which is excessively increased, may not be normally controlled in accordance with the set operation. In detail, the initial voltage setting condition may be controlled such that the channel of each of the source select transistor, the drain select transistor, and the dummy cell is maintained in an on state at the program step of the normal operation. When the threshold voltage of any one of the source select transistor, the drain select transistor, and the dummy cell is increased due to the increase in the number of program/erase cycles, and then degradation occurs, the degraded one of the source select transistor, the drain select transistor and the dummy cell may be in an off-state even if the program step of the normal operation is controlled depending on the initial voltage setting condition. In order to overcome such an operation failure, the embodiment of the present disclosure performs the program step of the retry operation RAP1 by increasing the voltage of at least one of the drain select line DSL, the dummy word line DWL, and the source select line SSL. Thus, the operation of the degraded one of the source select transistor, the drain select transistor, and the dummy cell may be maintained in a normal on-state at the program step of the retry operation RAP1.

The retry operation RAP1 includes step SP12 that is performed after step SP11. At step SP12, an i-th normal program loop is selected. "i" in FIG. 9A denotes the turn, i.e., the order of the normal program loop (which may also be referred to as "order (i)") of the corresponding normal program loop illustrated in FIG. 6A. The "i" may to correspond to k−x. Here, k may denote the last order of the normal program loop illustrated in FIG. 6A, and the value of x may be variously set within the range of numbers from 0 to a natural number less than k. Thereafter, the retry operation RAP1 includes step SP13 that is performed after step SP12. At step SP13, the selected i-th normal program loop is repeatedly performed. Next, at step SP15, whether the i-th normal program loop has passed is determined.

When the result of determination at step SP15 indicates a pass, the process proceeds to step SP5 described with reference to FIG. 6B.

When the result of determination at step SP15 indicates a fail, whether the order (i) of the normal program loop performed at step SP13 has reached the last order k is determined at step SP17. When it is determined at step SP17 that the order (i) of the normal program loop has not reached the last order k (that is, NO at step SP17), the order (i) of the corresponding normal program loop is increased by 1 at step SP19. Steps SP13, SP17, and SP19 are then repeatedly performed until the result of determination at step SP15 indicates a pass. When it is determined at step SP17 that the order (i) of the normal program loop has reached the last order k (that is, YES at step SP17), the process proceeds to step ST11 described with reference to FIG. 8A or step ST13 described with reference to FIG. 8C.

Referring to FIG. 9B, the retry operation RAP2 may be subsequently performed after step ST11 described with reference to FIG. 8A, step ST21 described with reference to FIG. 8B, or step ST41 described with reference to FIG. 8D.

When the threshold voltage of any one of a source select transistor SST, a drain select transistor DST, and a dummy cell DMC is increased due to the increase in the number of program/erase cycles, and then degradation occurs, the corresponding threshold voltage may be restored to an initially set value through step ST11, ST21 or ST41.

The retry operation RAP2 may include the step of repeatedly and sequentially performing normal program loops ranging from the first normal program loop of the normal program operation under the same voltage setting condition as that in the normal program operation described above with reference to FIG. 6B. In detail, the retry operation RAP2 includes step SP21. At step SP21, any of the normal program loops illustrated in FIG. 6A may be repeatedly performed. For example, the first normal program loop, in which the order (i) of the normal program loop is 1, may be performed. Thereafter, at step SP23, whether the normal program loop performed at step SP21 has passed is determined.

When the result of determination at step SP23 indicates a pass, the process proceeds to step SP5, illustrated in FIG. 6B.

When the result of determination at step SP23 indicates a fail, whether the order (i) of the normal program loop performed at step SP21 has reached the last order k is determined at step SP27. When it is determined at step SP27 that the order (i) of the normal program loop has not reached the last order k (that is, NO at step SP27), the order (i) of the normal program loop is increased by 1. Steps SP21, SP27, and SP29 are then repeatedly performed until the result of determination at step SP23 indicates a pass. When it is determined at step SP27 that the order (i) of the normal program loop has reached the last order k (that is, YES at step SP27), the process proceeds to step ST13 of FIG. 8A, step RA22 of FIG. 8B or step ST13 of FIG. 8D.

The retry operation RAP2 is performed after the threshold voltage of at least one of the source select transistor SST, the drain select transistor DST, and the dummy cell DMC, which is degraded, has been restored to an initial set value. Therefore, the fail state of the normal operation may be changed to a pass state by repeating the normal program loop in the retry operation RAP2 under the same voltage setting condition as that in the normal operation.

Figure 10B:
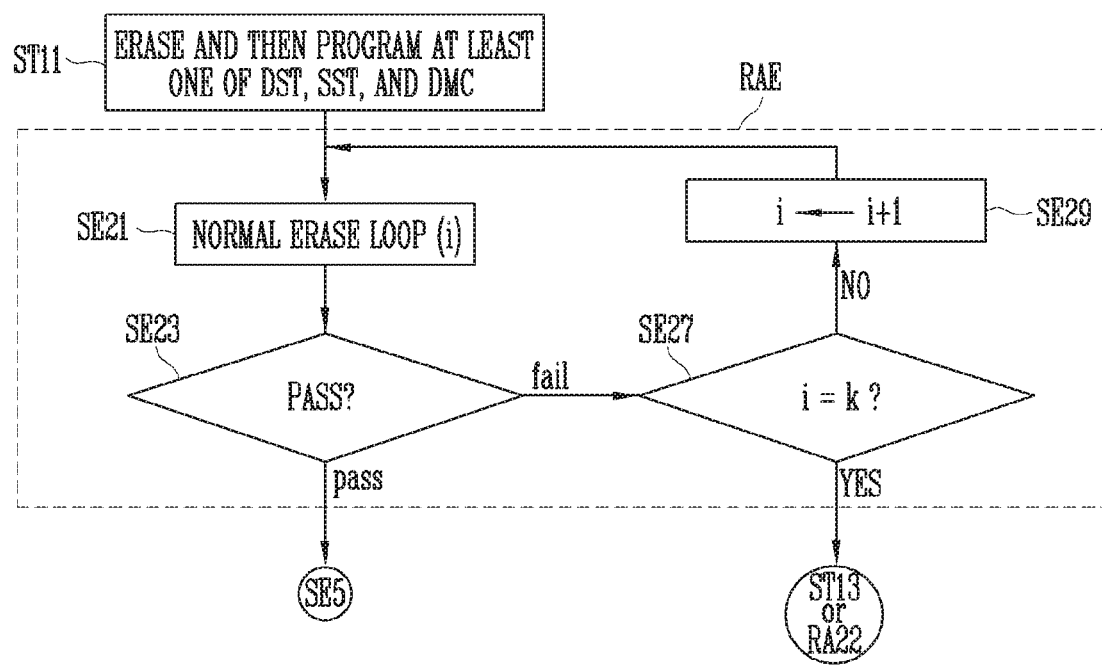

FIGS. 10A and 10B are diagrams illustrating retry operations based on the ISPE scheme. FIGS. 10A and 10B are associated with retry operations to be performed when the normal erase operation is determined to have failed in FIG. 7C. In detail, the retry operation illustrated in FIG. 10A may be applied to step RA11 of FIG. 8A, step RA22 of FIG. 8B, and step RA3 of FIG. 8C. A retry operation RAE illustrated in FIG. 10B may be applied to step RA12 of FIG. 8A, step RA21 of FIG. 86, and step RA4 of FIG. 8D.

Referring to FIG. 10A, the retry operation for an erase operation is performed by repeating normal erase loops and is performed by changing the length of a first interval t1' at an erase step. In greater detail, the first interval t1' of the retry operation for the erase operation is designated to be longer than the first interval t1 of the normal erase operation. In addition, during the retry operation, a second dummy word line voltage Vedwl2 applied to a dummy word line DWL may be designated to be equal to or lower than a first dummy word line voltage Vedwl1 in the normal erase operation.

Respective operations of a common source line CSL, a bit line BL, a drain select line DSL, a source select line SSL, word lines WL, and a channel of a cell string during a second interval t2 and a third interval t3 are identical to those described with reference to FIG. 7B.

Assuming that a source select transistor and a drain select transistor are degraded due to the increase in the number of program/erase cycles, the amount of GIDL may not be high enough to perform the erase operation even if the erase step of the normal operation is controlled depending on the initial voltage setting condition.

In order to overcome such an operation failure, the embodiment of the present disclosure may increase the amount of GIDL to a level high enough to perform the erase operation by increasing the time of the first interval t1'.

Referring to FIG. 10B, the retry operation RAE may be subsequently performed after step ST11 described with reference to FIG. 8A, step ST21 described with reference to FIG. 8B, or step ST41 described with reference to FIG. 8D.

The retry operation RAE may include repeatedly and to sequentially performing normal erase loops ranging from the first normal erase loop of the normal erase operation under the same voltage setting condition as that in the normal erase operation described above with reference to FIG. 7B. In detail, in the retry operation RAE, a first normal erase loop in which the order (i) of the normal erase loop is 1 may be performed at step SE21. Thereafter, at step SE23, whether the normal erase loop performed at step SE21 has passed is determined.

When the result of determination at step SP23 indicates a pass, the process proceeds to step SE5, illustrated in FIG. 7C.

When the result of determination at step SE23 indicates a fail, whether the order (i) of the normal erase loop performed at step SE21 has reached the last order k is determined at step SE27. When it is determined at step SE27 that the order (i) of the normal erase loop has not reached the last order k (that is, NO at step SE27), the order (i) of the normal erase loop is increased by 1 at step SE29. Steps SE21, SE27, and SE29 are then repeatedly performed until the result of determination at step SE23 indicates a pass. When it is determined at step SE27 that the order (i) of the normal erase loop has reached the last order k (that is, YES at step SE27), the process proceeds to step ST13 of FIG. SA, step RA22 of FIG. 8B or step ST13 of FIG. 8D.

The retry operation RAE is performed after the threshold voltage of at least one of the source select transistor SST, the drain select transistor DST, and the dummy cell DMC, which is degraded, has been restored to an initial set value. Therefore, the fail state of the normal to operation may be changed to a pass state by repeating the normal program loop in the retry operation RAE under the same voltage setting condition as that in the normal operation.

The above-described embodiments of the present disclosure may perform retry operations which are capable of overcoming degraded characteristics even if the characteristics of a source select transistor, a drain select transistor or a dummy cell are degraded due to an increase in the number of program/erase cycles. Therefore, the embodiments of the present disclosure may change the state of memory cells, determined to have failed after the completion of the normal operation loops performed based on the maximum operating pulse for programming or erasing, to a pass state before retry operations are performed.

In accordance with the above-described embodiments of the present disclosure, the deterioration of performance of a memory device attributable to an increase in the number of program/erase cycles may be decreased.

Figure 11:
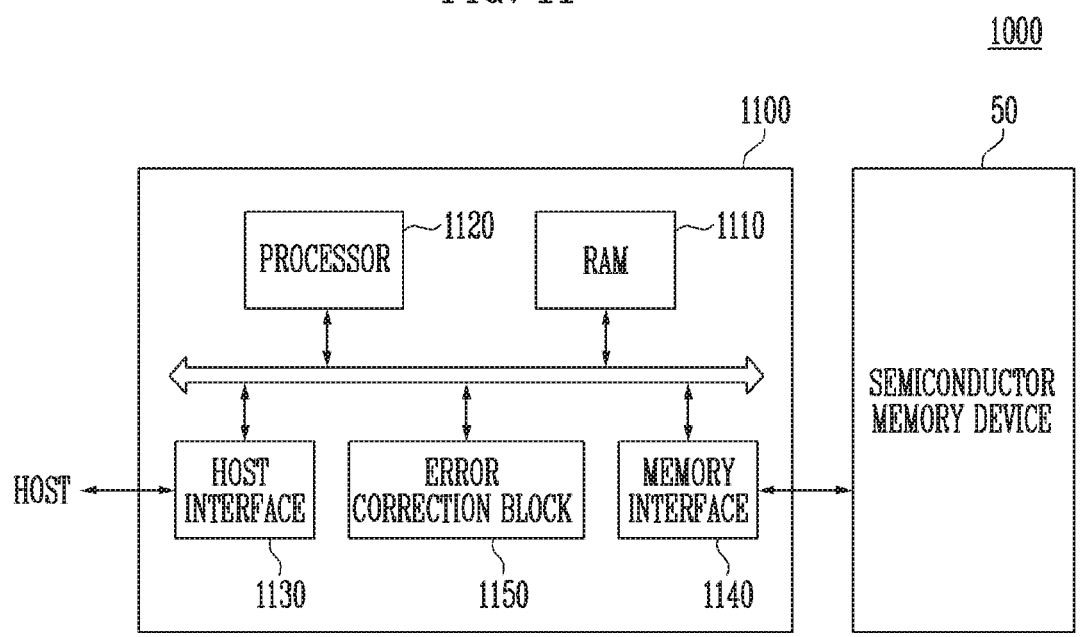
FIGS. 11 and 12 are block diagrams illustrating a memory system according to various embodiments.
Figure 12:
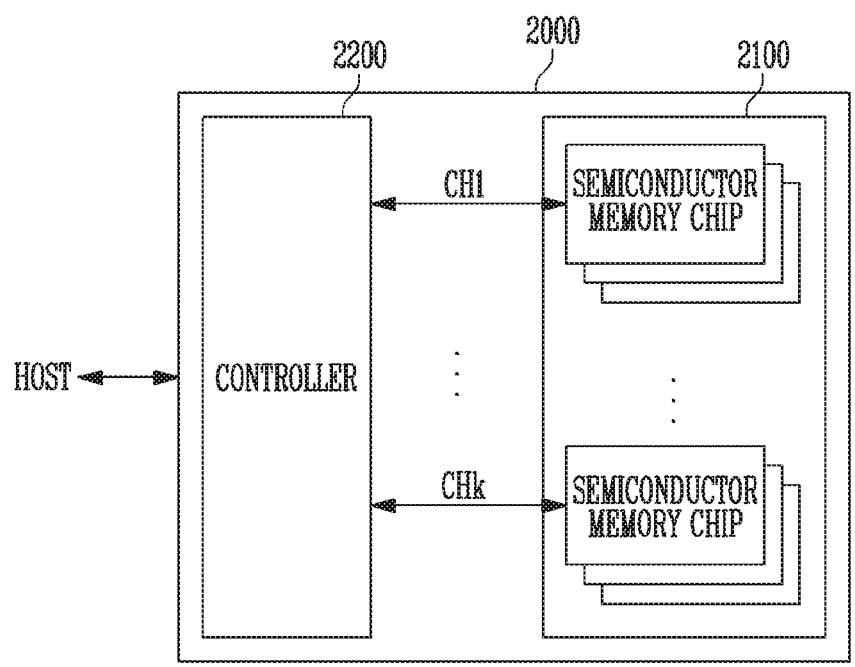

FIGS. 11 and 12 are block diagrams illustrating a memory system according to various embodiments.

Referring to FIG. 11, a memory system 1000 includes a semiconductor memory device 50 and a controller 1100. The semiconductor memory device 50 may be the semiconductor memory device described with reference to FIG. 3. Hereinafter, repetitive explanations will be omitted.

The controller 1100 is coupled to a host and the semiconductor memory device 50. In response to a request from the host, the controller 1100 may access the semiconductor memory device 50. For example, the controller 1100 may control read, program, erase, and background operations of the semiconductor memory device 50.

The controller 1100 may provide an interface between the semiconductor memory device 50 and the host. The controller 1100 may run firmware for controlling the semiconductor memory device 50.

The controller 1100 includes a random access memory (RAM) 1110, a processor 1120, a host interface 1130, a memory interface 1140, and an error correction block 1150.

The RAM 1110 is used as at least one of a working memory for the processor 1120, a cache memory between the semiconductor memory device 50 and the host, and a buffer memory between the semiconductor memory device 50 and the host. The processor 1120 controls the overall operation of the controller 1100. In addition, the controller 1100 may temporarily store program data provided from the host during a program operation.

The host interface 1130 includes a protocol for performing data exchange between the host and the controller 1100. The protocol may be implemented as at least one of interface protocols in various examples described above with reference to FIG. 1.

The memory interface 1140 interfaces with the semiconductor memory device 50. For example, the memory interface 1140 includes a NAND interface or a NOR interface.

The error correction block 1150 may detect and correct errors in data received from the semiconductor memory device 50 using an error correction code (ECC). The processor 1120 may adjust a read voltage based on the result of error detection by the error correction block 1150, and may control the semiconductor memory device 50 to perform re-reading. In an embodiment, the error correction block 1150 may be provided as the component of the controller 1100.

The controller 1100 and the semiconductor memory device 50 may be integrated into a single semiconductor device. In an embodiment, the controller 1100 and the semiconductor memory device 50 may be integrated into a single semiconductor device to form a memory card. For example, the controller 1100 and the semiconductor memory device 50 may be integrated into a single semiconductor device to form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The controller 1100 and the semiconductor memory device 50 may be integrated into a single semiconductor device to form a solid state drive (SSD). The SSD includes a storage device configured to store data in a semiconductor memory. When the memory system 1000 is used as the SSD, the operating speed of the host coupled to the memory system 2000 may be phenomenally improved.

In other examples, the memory system 1000 may be provided as one of various components of an electronic device. The electronic device may be one of various electronic devices such as a computer, a ultra mobile PC (UMPC), a workstation, a netbook, a personal digital assistant (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices constituting a home network, one of various electronic devices constituting a computer network, one of various electronic devices constituting a telematics network, an RFID device, or one of various elements constituting a computing system.

In an exemplary embodiment, the semiconductor memory device 50 or the memory system 1000 may be embedded in various types of packages. For example, the semiconductor memory device 50 or the memory system 1000 may be packaged and mounted in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Referring to FIG. 12, a memory system 2000 includes a semiconductor memory device 2100 and a controller 2200. The semiconductor memory device 2100 may include a plurality of semiconductor memory chips. The semiconductor memory chips are divided into a plurality of groups.

Each of the groups communicates with the controller 2200 through first to k-th channels CH1 to CHk. Each semiconductor memory chip may be configured and operated in the same manner as the semiconductor memory device 50 described above with reference to FIG. 3.

Each group may communicate with the controller 2200 through one common channel. The controller 2200 has the same configuration as the controller 1100 described with reference to FIG. 11 and is configured to control the plurality of memory chips of the semiconductor memory device 2100 through the plurality of channels CH1 to CHk.

Figure 13:
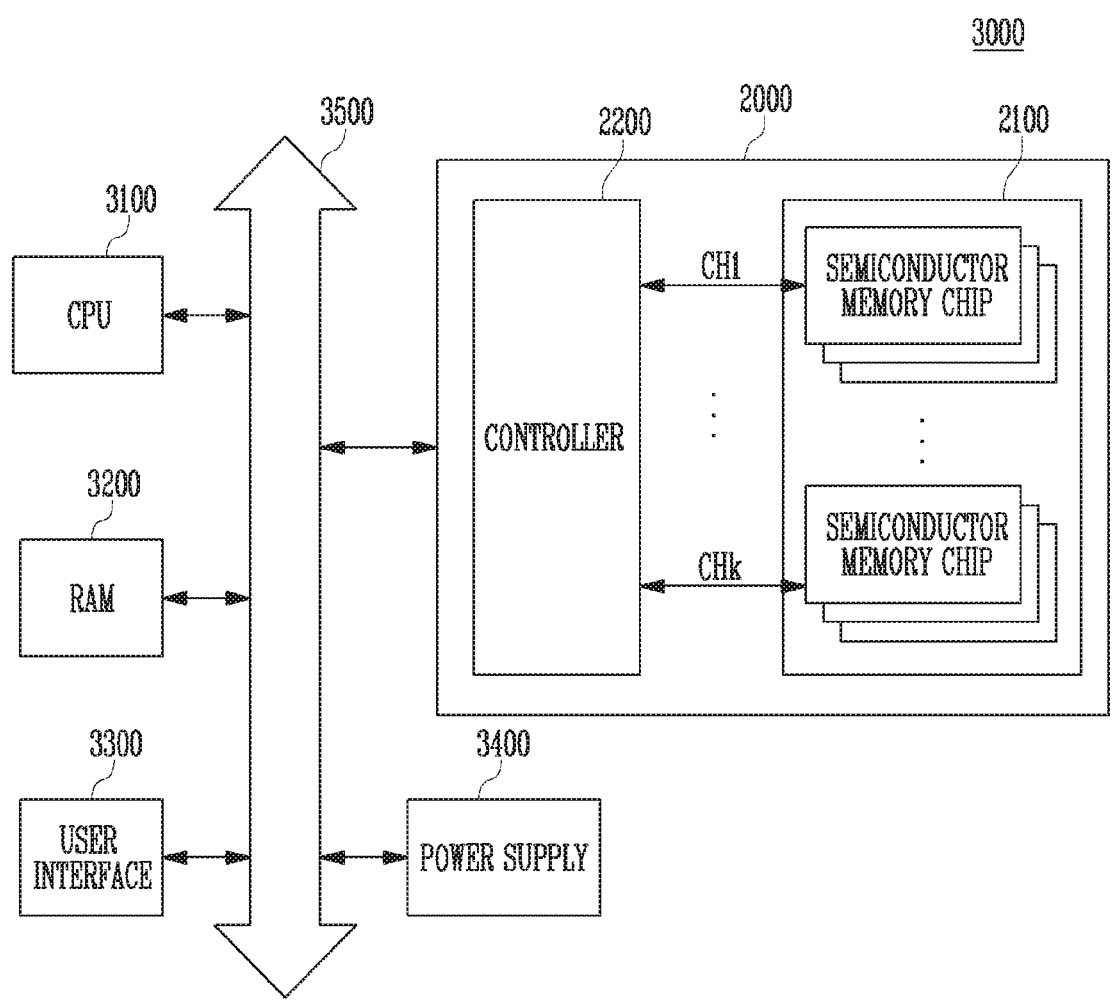
FIG. 13 is a block diagram illustrating a computing system according to an embodiment of the present disclosure.

FIG. 13 is a block diagram illustrating a computing system according to an embodiment of the present disclosure.

A computing system 3000 may include a central processing unit (CPU) 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 may be stored in the memory system 2000.

A semiconductor memory device 2100 may be coupled to the system bus 3500 through the controller 2200. Unlike this, the semiconductor memory device 2100 may be directly coupled to the system bus 3500. Here, the function of the controller 2200 may be performed by the CPU 3100 and the RAM 3200.

FIG. 13 illustrates the computing system 3000 including the memory system 2000 explained with reference to FIG. 12. However, the embodiment of the present disclosure is not limited to such an example. For example, the memory system 2000 of the computing system 3000 may be replaced with the memory system 1000, described above with reference to FIG. 11. In an embodiment, the computing system 3000 may include all of the memory systems 1000 and 2000 described with reference to FIGS. 11 and 12.

The embodiments disclosed in the present specification and the drawings are merely intended to help those skilled in the art more clearly understand the present disclosure rather than limiting the scope of the present disclosure. It is apparent to those skilled in the art to which the present disclosure pertains that many variations and modifications of the basic inventive concept described herein will still fall within the spirit and scope of the present disclosure as defined in the accompanying claims and equivalents thereof.

Therefore, the embodiments of the present disclosure may change the state of memory cells, determined to have failed after the completion of the normal operation loops performed based on the maximum operating pulse for programming or erasure, to a pass state before retry operations are performed.

Unless otherwise defined, all terms including technical and scientific terms used herein have the same meaning as commonly understood by those skilled in the art to which the present disclosure pertains. The terms are not interpreted as being ideal or excessively formal meanings unless they are definitely defined in the present specification.

What is claimed is:

1. A method of operating a memory device, the method comprising:
    performing a normal operation including normal operation loops so that a selected memory cell in a selected cell string has a target threshold voltage, wherein the normal operation loops are performed based on an operating voltage that is sequentially increased by a step voltage from a first operating pulse to a k-th operating pulse; and
    performing a first retry operation of repeating at least one of the normal operation loops when the selected memory cell does not reach the target threshold voltage after a k-th normal operation loop for the k-th operating pulse of the normal operation,
    wherein at least one of a first voltage setting condition for a source select line coupled to a source select transistor of the selected cell string, a second voltage setting condition for a drain select line coupled to a drain select transistor of the selected cell string, and a third voltage setting condition for a dummy word line coupled to a dummy cell of the selected cell string is controlled in the first retry operation in a way different from that in the normal operation.

2. The method according to claim 1, wherein the performing of the first retry operation comprises sequentially and repeatedly performing, within a range from an i-th (where 1≤i≤k) normal operation loop based on an i-th operating pulse to the k-th normal operation loop, at least one of normal operation loops ranging from the i-th normal operation loop to the k-th normal operation loop until a threshold voltage of the selected memory cell reaches the target threshold voltage.

3. The method according to claim 1, further comprising:
    performing, when the k-th normal operation loop of the first retry operation fails, a threshold voltage reset operation of erasing and then programming at least one of the source select transistor, the drain select transistor, and the dummy cell; and
    performing, after the threshold voltage reset operation, a second retry operation of repeating at least one of the normal operation loops.

4. The method according to claim 3, wherein the second retry operation comprises sequentially and repeatedly performing, within a range from a first normal operation loop based on the first operating pulse to the k-th normal operation loop, at least one of the normal operation loops until the threshold voltage of the selected memory cell reaches the target threshold voltage.

5. The method according to claim 3, wherein the first to third voltage setting conditions are controlled in the second retry operation in a way identical to that in the normal operation.

6. The method according to claim 1, wherein each of the normal operation loops in the normal operation and the first retry operation comprises:
   applying a program voltage corresponding to the operating voltage to a word line coupled to the selected memory cell; and
   verifying whether the selected memory cell has been programmed by applying a program verify voltage to the word line.

7. The method according to claim 6, wherein, in the applying the program voltage corresponding to the operating voltage, at least one of levels of voltages applied to the source select line, the drain select line, and the dummy word line is controlled to be higher in the first retry operation than in the normal operation.

8. The method according to claim 1,
   wherein each of the normal operation loops comprises:
   applying an erase voltage corresponding to the operating voltage to a common source line coupled to a channel of the selected cell string; and
   verifying whether the selected memory cell has been erased by applying an erase verify voltage to a word line coupled to the selected memory cell, and
   wherein the applying the erase voltage corresponding to the operating voltage comprises:
   a first interval during which a select voltage is applied to the source select line and the drain select line, and a precharge voltage is applied to the common source line;
   a second interval during which the precharge voltage applied to the common source line is increased to the erase voltage, and the drain select line and the source select line are caused to float; and
   a third interval during which the erase voltage is maintained and applied.

9. The method according to claim 8, wherein the first interval is controlled to be longer in the first retry operation than in the normal operation.

10. The method according to claim 9, wherein a level of the select voltage is controlled to be lower in the first retry operation than in the normal operation.

11. A method of operating a memory device, the method comprising:
   performing a normal operation including normal operation loops so that a selected memory cell in a selected cell string has a target threshold voltage, wherein the normal operation loops are performed based on an operating voltage that is sequentially increased by a step voltage from a first operating pulse to a k-th operating pulse;
   resetting a threshold voltage of at least one of a source select transistor of the selected cell string, a drain select transistor of the selected cell string, and a dummy cell of the selected cell string when the selected memory cell does not reach the target threshold voltage after a k-th normal operation loop for the k-th operating pulse of the normal operation; and
   performing a first retry operation of repeating at least one of the normal operation loops after the threshold voltage has been reset.

12. The method according to claim 11, wherein resetting the threshold voltage comprises erasing and then programming at least one of the source select transistor, the drain select transistor, and the dummy cell.

13. The method according to claim 11, wherein the first retry operation comprises sequentially and repeatedly performing, within a range from a first normal operation loop based on the first operating pulse to the k-th normal operation loop, at least one of the normal operation loops until a threshold voltage of the selected memory cell reaches the target threshold voltage.

14. The method according to claim 13,
   further comprising performing, when the k-th normal operation loop of the first retry operation fails, a second retry operation of repeating at least one of the normal operation loops,
   wherein at least one of a first voltage setting condition for a source select line coupled to the source select transistor, a second voltage setting condition for a drain select line coupled to the drain select transistor, and a third voltage setting condition for a dummy word line coupled to the dummy cell is controlled in the second retry operation in a way different from that in the first retry operation.

15. The method according to claim 14, wherein the first to third voltage setting conditions are controlled in the first retry operation in a way identical to that in the normal operation.

16. The method according to claim 14, wherein the second retry operation comprises
   sequentially and repeatedly performing, within a range from an i-th (where 1<i≤k) normal operation loop based on an i-th operating pulse to the k-th normal operation loop, at least one of the i-th to k-th normal operation loops until the threshold voltage of the selected memory cell reaches the target threshold voltage.

17. The method according to claim 14, wherein each of the normal operation loops in the normal operation and the second retry operation comprises:
   applying a program voltage corresponding to the operating voltage to a word line coupled to the selected memory cell; and
   verifying whether the selected memory cell has been programmed by applying a program verify voltage to the word line.

18. The method according to claim 17, wherein, in the applying the program voltage corresponding to the operating voltage, at least one of levels of voltages applied to the source select line, the drain select line, and the dummy word line is controlled to be higher in the second retry operation than in the normal operation.

19. The method according to claim 14,
   wherein each of the normal operation loops comprises:
   applying an erase voltage corresponding to the operating voltage to a common source line coupled to a channel of the selected cell string; and
   verifying whether the selected memory cell has been erased by applying an erase verify voltage to a word line coupled to the selected memory cell, and
   wherein the applying the erase voltage corresponding to the operating voltage comprises:
   a first interval during which a select voltage is applied to the source select line and the drain select line, and a precharge voltage is applied to the common source line;
   a second interval during which the precharge voltage applied to the common source line is increased to the erase voltage, and the drain select line and the source select line are caused to float; and
   a third interval during which the erase voltage is maintained and applied.

20. The method according to claim 19, wherein the first interval is controlled to be longer in the second retry operation than in the normal operation.

21. The method according to claim 20, wherein a level of the select voltage is controlled to be lower in the first retry operation than in the normal operation.

22. An operating method of a memory device, the method comprising:
performing a normal program operation to a memory cell so that the memory cell has a target threshold voltage; and
performing, when the memory cell does not reach the target threshold voltage after the normal program operation, a retry program operation to the memory cell by increasing one or more among voltages applied to the source select line, the drain select line and the dummy word line for the memory cell.

23. An operating method of a memory device, the method comprising:
performing a normal program operation to a memory cell so that the memory cell has a target threshold voltage;
resetting, when the memory cell does not reach the target threshold voltage after the normal program operation, threshold voltages of one or more among a source select transistor, a drain select transistor and a dummy cell for the memory cell; and
performing a retry program operation to the memory cell.

24. An operating method of a memory device, the method comprising:
performing a normal erase operation to a memory cell so that the memory cell has a target threshold voltage; and
performing, when the memory cell does not reach the target threshold voltage after the normal erase operation, a retry erase operation to the memory cell by applying a precharge voltage and a select voltage for a longer duration than the normal erase operation.

25. An operating method of a memory device, the method comprising:
performing a normal erase operation to a memory cell so that the memory cell has a target threshold voltage;
resetting, when the memory cell does not reach the target threshold voltage after the normal erase operation, threshold voltages of one or more among a source select transistor, a drain select transistor and a dummy cell for the memory cell; and
performing a retry erase operation to the memory cell.

* * * * *